(12) United States Patent
Omenetto et al.

(10) Patent No.: US 11,001,685 B2
(45) Date of Patent: May 11, 2021

(54) SILK-BASED NANOIMPRINTING

(71) Applicant: Tufts University, Medford, MA (US)

(72) Inventors: Fiorenzo G. Omenetto, Lexington, MA (US); David L. Kaplan, Concord, MA (US); Mark A. Brenckle, Northborough, MA (US)

(73) Assignee: Tufts University, Medford, MA (US)

( * ) Notice: Subject to any disclaimer, the term of this patent is extended or adjusted under 35 U.S.C. 154(b) by 0 days.

(21) Appl. No.: 15/905,274

(22) Filed: Feb. 26, 2018

(65) Prior Publication Data

US 2019/0085140 A1    Mar. 21, 2019

Related U.S. Application Data

(63) Continuation of application No. 14/765,202, filed as application No. PCT/US2014/016630 on Feb. 14, 2014, now abandoned.

(60) Provisional application No. 61/827,544, filed on May 24, 2013, provisional application No. 61/765,621, filed on Feb. 15, 2013.

(51) Int. Cl.
| | |
|---|---|
| *C08J 5/18* | (2006.01) |
| *G03F 7/00* | (2006.01) |
| *C08L 89/00* | (2006.01) |
| *B41C 1/10* | (2006.01) |
| *B82Y 40/00* | (2011.01) |

(52) U.S. Cl.
CPC .................. *C08J 5/18* (2013.01); *B41C 1/10* (2013.01); *C08L 89/00* (2013.01); *G03F 7/0002* (2013.01); *B82Y 40/00* (2013.01); *C08J 2389/00* (2013.01); *C08L 2205/025* (2013.01); *Y10T 428/24479* (2015.01)

(58) Field of Classification Search
CPC . B41C 1/10; C08J 5/18; C08J 2389/00; C08L 89/00; C08L 2205/025; G03F 7/0002; B82Y 40/00; Y10T 428/24479
See application file for complete search history.

(56) References Cited

U.S. PATENT DOCUMENTS

| | | | | |
|---|---|---|---|---|
| 2008/0280360 A1* | 11/2008 | Kaplan | ............... | C12N 5/0068 |
| | | | | 435/396 |
| 2009/0202614 A1* | 8/2009 | Kaplan | ................. | A61P 43/00 |
| | | | | 424/443 |

(Continued)

FOREIGN PATENT DOCUMENTS

| | | |
|---|---|---|
| WO | 2008118211 A2 | 10/2008 |
| WO | 2008127401 A2 | 10/2008 |

(Continued)

OTHER PUBLICATIONS

Omenetto et al. ("Protein-Protein Imprinting (PPi): High Throughput Nanoscale Imprinting of silk Fibroin Films for Photonics" CLEO: Science and Innovations, Optical Society of America, 2012, p. CM4L-2) (Year: 2012).*

(Continued)

*Primary Examiner* — Travis M Figg
(74) *Attorney, Agent, or Firm* — Quarles & Brady LLP

(57) ABSTRACT

Protein-protein imprinting of silk fibroin is introduced as a rapid, high-fidelity, and/or high-throughput method for the fabrication of nanoscale structures in silk films, through controlled manipulation of heat and/or pressure. High resolution imprinting on conformal surfaces is also demonstrated.

23 Claims, 28 Drawing Sheets

Schematics of the PiP process and replication mechanism

(56) References Cited

U.S. PATENT DOCUMENTS

| | | | | |
|---|---|---|---|---|
| 2011/0111031 | A1* | 5/2011 | Jiang | A61K 38/17 424/484 |
| 2012/0034291 | A1* | 2/2012 | Amsden | B82Y 20/00 424/443 |
| 2012/0121820 | A1* | 5/2012 | Kaplan | B82Y 40/00 427/552 |
| 2012/0165759 | A1* | 6/2012 | Rogers | A61B 5/6883 604/264 |

FOREIGN PATENT DOCUMENTS

| | | |
|---|---|---|
| WO | 2008127402 A2 | 10/2008 |
| WO | 2008127403 A2 | 10/2008 |
| WO | 2008127404 A2 | 10/2008 |
| WO | 2008127405 A2 | 10/2008 |
| WO | 2008140562 A2 | 11/2008 |
| WO | 2009061823 A1 | 5/2009 |
| WO | 2009155397 A2 | 12/2009 |
| WO | 2010088585 A1 | 8/2010 |
| WO | 2010126640 A2 | 11/2010 |
| WO | 2011026101 A2 | 3/2011 |
| WO | 2011046652 A2 | 4/2011 |
| WO | 2011112931 A1 | 9/2011 |
| WO | 2011115643 A1 | 9/2011 |
| WO | 2011130335 A2 | 10/2011 |
| WO | 2011160098 A2 | 12/2011 |
| WO | 2012031282 A2 | 3/2012 |
| WO | 2012047682 A2 | 4/2012 |
| WO | 2012054121 A2 | 4/2012 |
| WO | 2012094436 A2 | 7/2012 |
| WO | 2012145739 A1 | 10/2012 |

OTHER PUBLICATIONS

Brenckle et al. ("Protein-Protein Imprinting (PPi): High Throughput Nanoscale Imprinting of Silk Fibroin Films for Photonics" CLEO: Science and Innovation, Optical Society of America, published May 2012, CM4L-2).*
Tufts University "High-Tech Silk", https://www.eurekalert.org/multimedia/pub/24327.php, published on Aug. 2010 (Year: 2010).*
Way Back Machine_Tufts_2010 (Year: 2010).*
Definition of Fibroin (Year: 2020).*
Agarwal, N. et al., Effect of Moisture Absorption on the Thermal Properties of Bombyx mori Silk Fibroin Films, Journal of Applied Polymer Science, 63(3):401-410 (1997).
Amsden, J.J. et al., Rapid Nanoimprinting of Silk Fibroin Films for Biophotonic Applications, Advanced Materials, 22(15):1746-1749 (2010).
Brenckle, M.A. et al, Protein-Protein Nanoimprinting of Silk Fibroin Films, Advanced Materials, 25(17): 2409-2414 (2013).
Choi, W.M. and Park, 0.0., The fabrication of submicron patterns on curved substrates using a polydimethylsilozane film mould, Nanotechnology, 15(12):1767-1770 (2004).
Domachuk, P. et al., Bioactive "self-sensing" optical systems, Applied Physics Letters, 95(25):253702 (2009).
Farshchian, B. et al., Soft UV-nanoimprint lithography on non-planar surfaces, Microelectric Engineering, 88:3287-3292 (2011).
Galeotti, F. et al, Precise surface patterning of silk fibroin films by breath figures, Soft Matter, 8(17): 4815-4821 (2012).
Gupta, M.K. et al, Patterned silk films cast from ionic liquid solubilized fibroin as scaffolds for cell growth, Langmuir, 23(3): 1315-9 (2007).
Hoshino, K. et al., IEE Conference on Micro-Electro Mechanical Systems, 429-434 (1999).
Hu, X. et al., Determining Beta-Sheet Crystallinity in Fibrous Proteins by Thermal Analysis and Infrared Spectroscopy, Macromolecules, 39:6161-6170 (2006).
Hu, X. et al., Effect of water on the thermal properties of silk fibroin, Thermochimica Acta, 461(1-2):137-144 (2007).
Hu, X. et al., Regulation of silk material structure by temperature-controlled water vapor annealing, Biomacromolecules, 12(5):1686-1696 (2011).
International Search Report for PCT/US2014/016630, 5 pages, dated 5, 2014.
Jacobs, H.O. et al., Fabrication of a Cylindrical Display by Patterned Assembly, Science 296(5566):323-325 (2002).
Jin,H-J et al., Electrospinning Bombyx mori Silk with Poly(ethylene oxide), Biomacromolecules, American Chemical Society, 3(6):1233-1239 (2002).
Kim, D. et al., Dissolvable films of silk fibroin for ultrathin conformal bio-integrated electronics, Nature Materials, 9:511-517 (2010).
Kim, D.H. et al., Epidermal Electronics, Science, 333(6044):838-843 (2011).
Lawrence, B. et al., Processing methods to control silk fibroin film biomaterial features, Journal of Materials Science, 43:6967-6985 (2008).
Lawrence, B.D. et al., Bioactive silk protein biomaterial systems for optical devices, Biomacromolecules, 9:1214-1220 (2008).
Lee, S.Y. et al., Spatial and spectral detection of protein monolayers with deterministic aperiodic arrays of metal nano particles, PNAS, 107(27):12086-12090 (2010).
Lorenz-Fonfria, V.A. and Padros, E., Curve-fitting of Fourier manipulated spectra comprising apodization, smoothing, derivation, and deconvolution, Spectrochimica Acta A Mol Biolmol Spectrosc, 60(12):2703-2710 (2004).
Mandal, B. et al, Non-bioengineered silk gland fibroin micromolded matrices to study cell-surface interactions, Biomedical Microdevices, 11 (2): 467-4 76 (2009).
Meinel, L. et al., Silk based biomaterials to heal critical sized femur defects, Bone, 39(4):922-931 (2006).
Mishchenko, L. et al., Design of Ice-free Nanostructured Surfaces Based on Repulsion of Impacting Water Droplets, ACS Nano, 4(12):7699-7707 (2010).
Mondia J.P. et al., Rapid nanoimprinting of doped silk films for enhanced fluorescent emission. Adv. Mater. 22: 4596-4599 (2010).
Mukherjee, R. et al., Solvent Vapor-Assistant Imprinting of Polymer Films Coated on Curved Surfaces with Flexible PVA Stamps, Ind. Eng. Chem. Res., 48(19):8812-8818 (2009).
Perry, H. et al., Nano- and Micropatterning of Optically Transparent, Mechanically Robust, Biocompatible Silk Fibroin Films, Advanced Materials, 20:3070-3072 (2008).
Pritchard, E. et al., Silk fibroin encapsulated powder reservoirs for sustained release of adenosine, Journal of Controlled Release Society, 144(2):159-167 (2010).
Santin, M. et al., In vitro evaluation of the inflammatory potential of the silk fibroin, Journal of Biomedical Material Research, 46(3):382-389 (1999).
Sofia, S. et al., Functionalized silk-based biomaterials for bone formation, Journal of Biomedical Materials Research, 54(1): 139-148 (2001).
Tao, H. et al., Metamaterials on paper as a sensing platform, Advanced Materials, 23(28):3197-3201 (2011).
Tao, H. et al., Silk Materials—A Road to Sustainable High technology, Advanced Materials, 24:2824-2837 (2012).
Tao, H. et al., Silk-based conformal, adhesive, edible food sensors, Adv. Mater., 24(8):1067-72 (2012).
Tsioris, K. et al., Fabrication of Silk Microneedles for Controlled-Release Drug Delivery, Advanced Functional Materials, 22(2):330-335 (2012).
Tsioris, K. et al., Functionalized-Silk-Based Active Optofluidic Devices, Advanced Functional Materials, 20(7):1083-1089 (2010).
Tsioris, K. et al., Rapid Transfer-based micropatterning and dry etching of silk microstructures, Adv. Mater. 23(17): 2015-2019 (2011).
Viventi, J. et al., Flexible, Foldable, Actively Multiplexed, High-Density Electrode Array for Mapping Brain Activity in vivo, Nature Neuroscience, 14(12):1599-1605 (2011).
Wei, Q.N. et al., Structure regulation of silk fibroin films for controlled drug release, Journal of Applied Polymer Science, 125(S2):E477-E484 (2012).

(56) References Cited

OTHER PUBLICATIONS

White, R.D. et al., Journal of Micromechanics and Microengineering, 21:115014 (2011).
Written Opinion of PCT/US2014/016630, 9 pages, dated Jun. 5, 2014.
Xie, Y. et al., Fabrication of large diffractive optical elements in thick film on a concave lens surface, Optics Express, 11 (9):992-995 (2003).
Zhang, J. et al., Stabilization of vaccines and antibiotics in silk and eliminating the cold chain, Proc. Natl. Acad. Sci. USA, 109(30):11981-6 (2012).

* cited by examiner

Figure 1: Schematics of the PiP process and replication mechanism

Figure 2: Characterization of multi-generation PiP imprint

Figure 3: Characterization of PiP parameter space

Figure 4: Conformal PiP and surface transfer

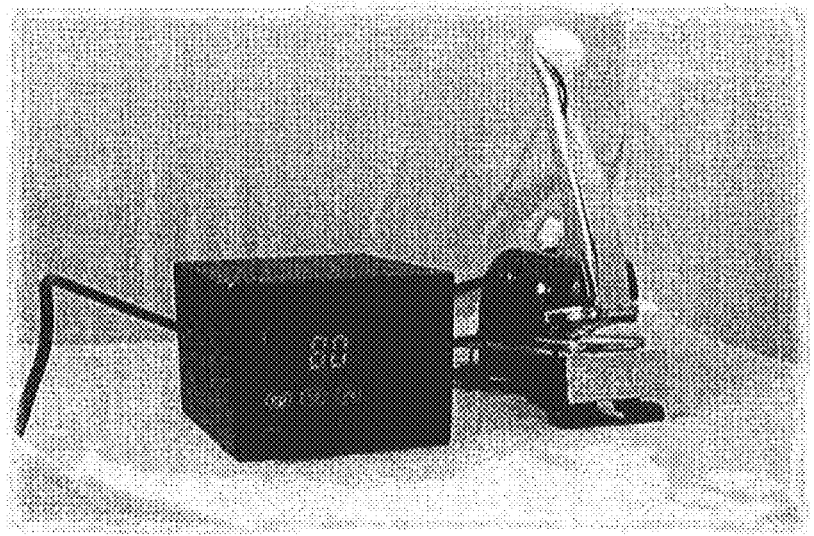
Figure 13: Desktop Embossing System

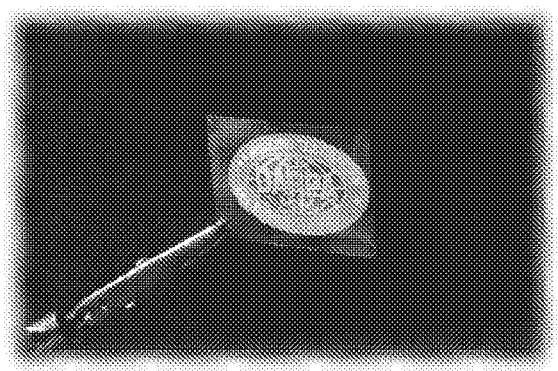
Figure 14: Nickel Master

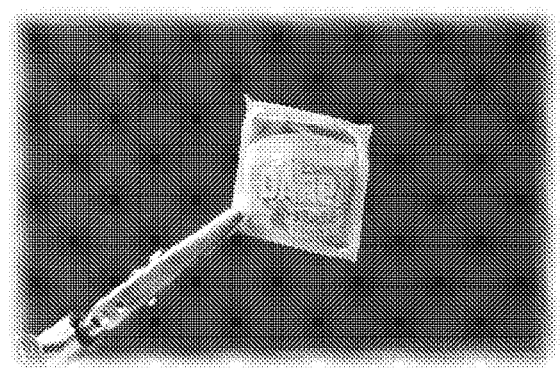
Figure 15: Imprinted Silk Film

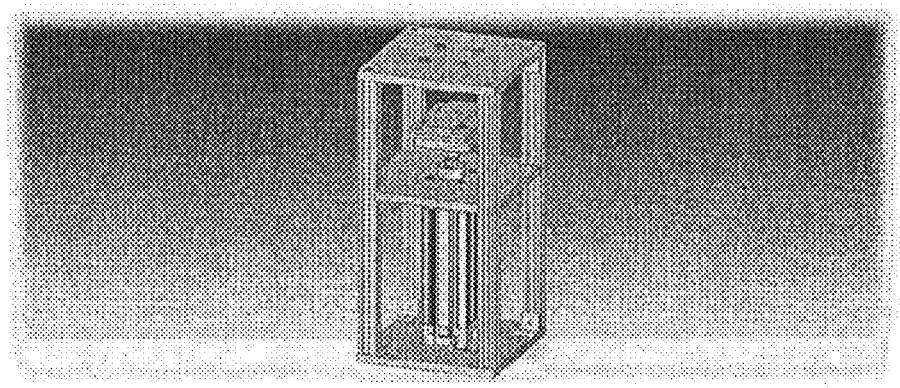
Figure 16: 3-D Drawing of Embossing System
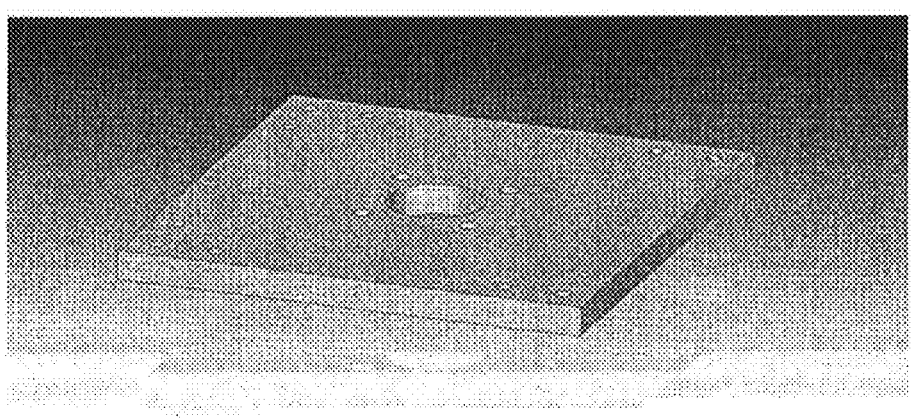
Figure 17: Bottom Plate

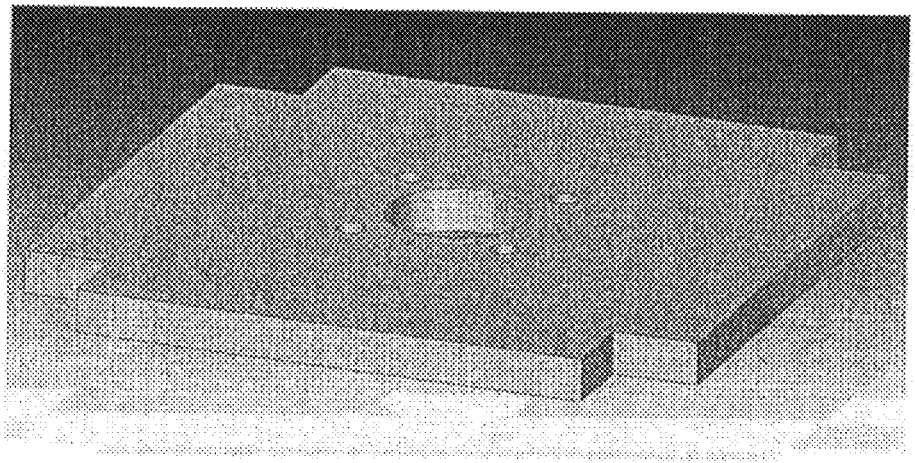
Figure 18: Center Plate
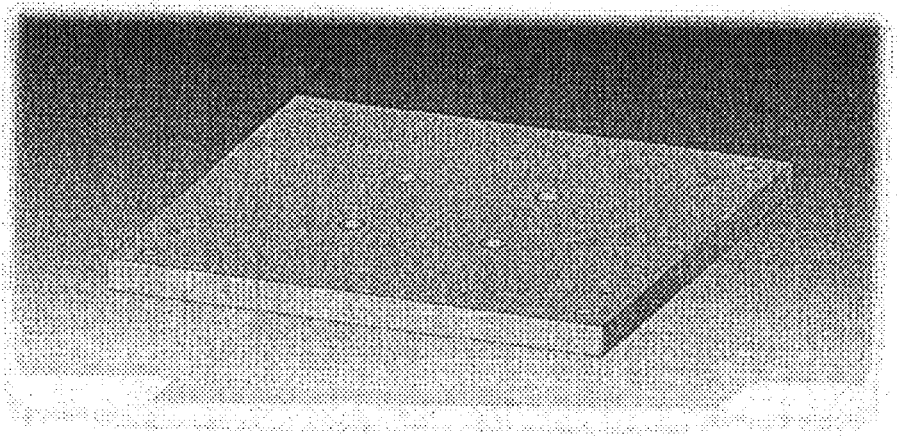
Figure 19: Top Plate

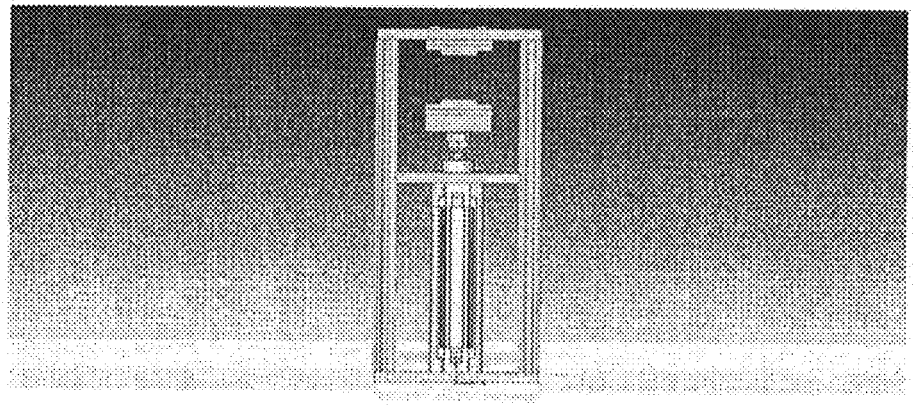
Figure 20: Front View of Embosser
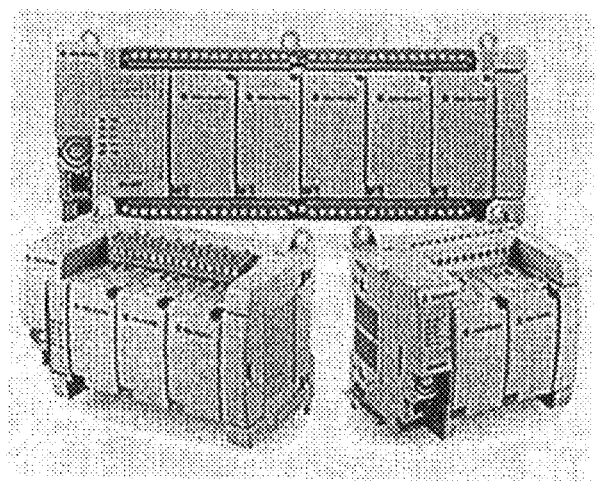
Figure 21: Allen-Bradley Family of PLCs (11)

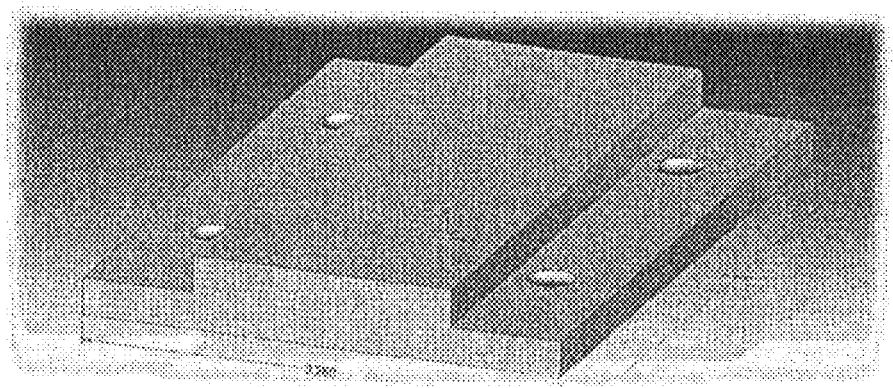
Figure 22: Heated Plate Design
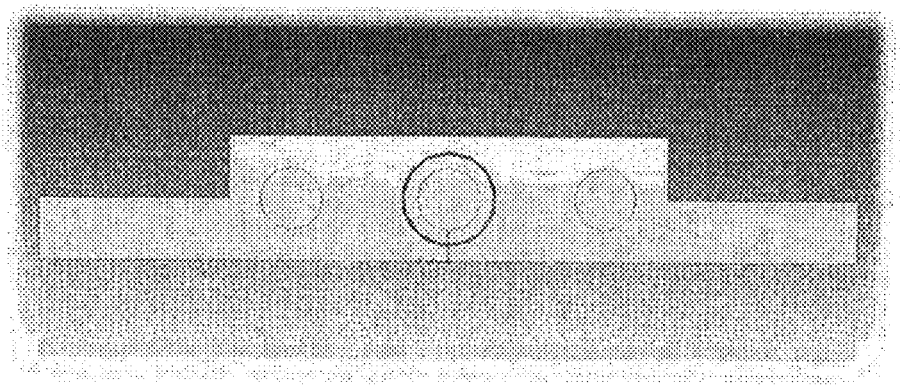
Figure 23: Heated Plate – Back

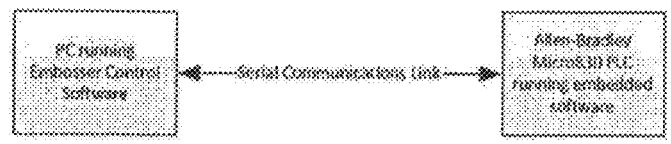
Figure 24: Embosser Control Software
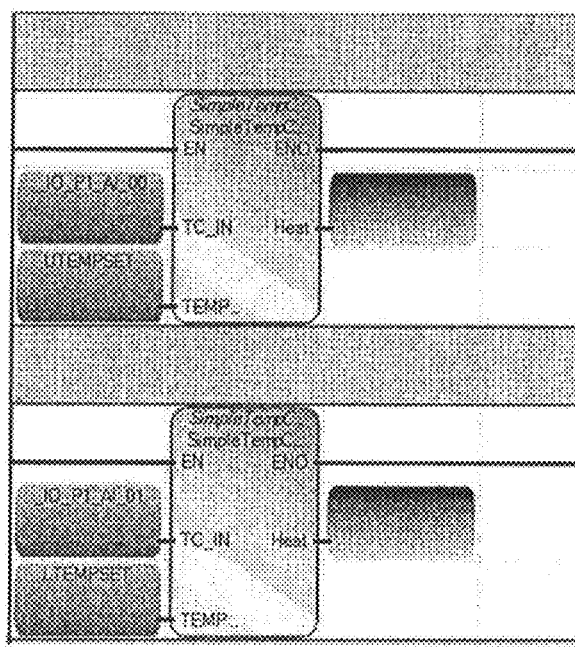
Figure 25: Temperature Control Rungs

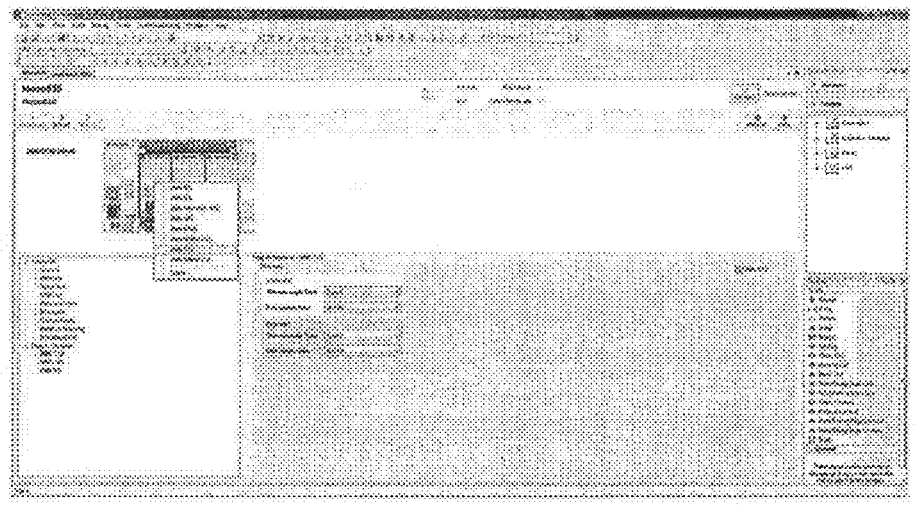
Figure 26: TC2 Module Selection
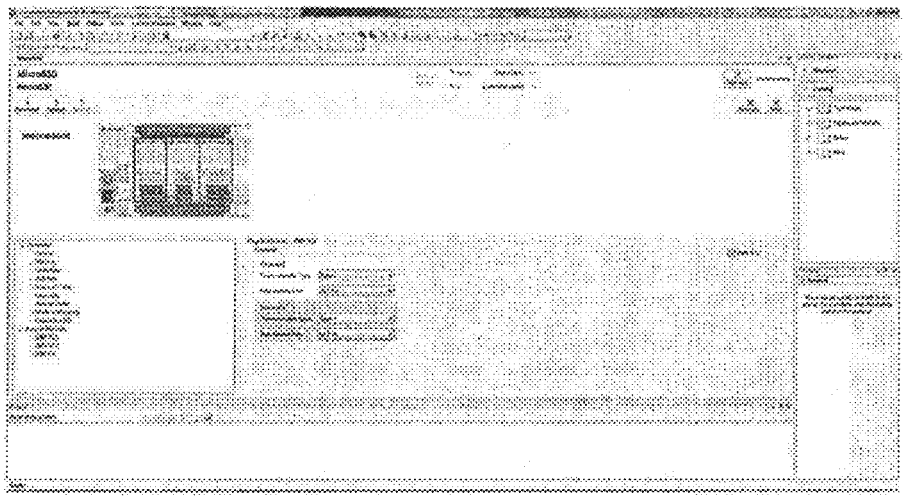
Figure 27: Configuration of TC2 module

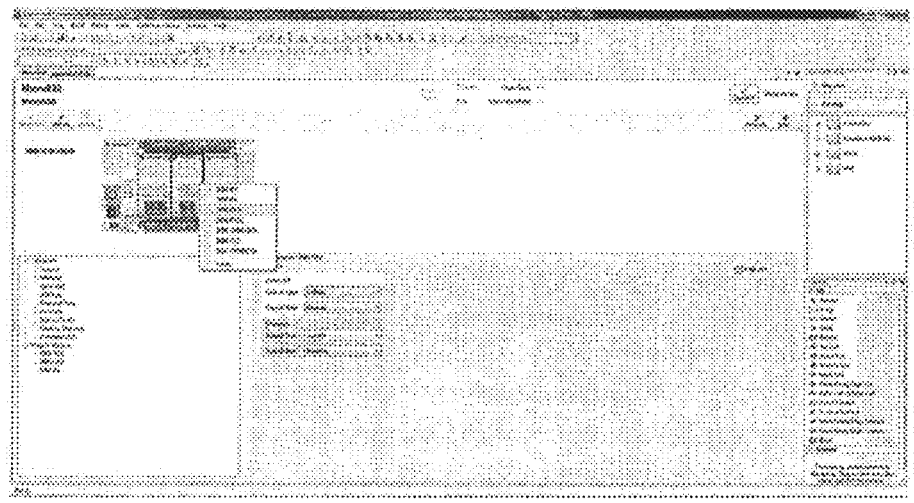
Figure 28: OF2 module selection
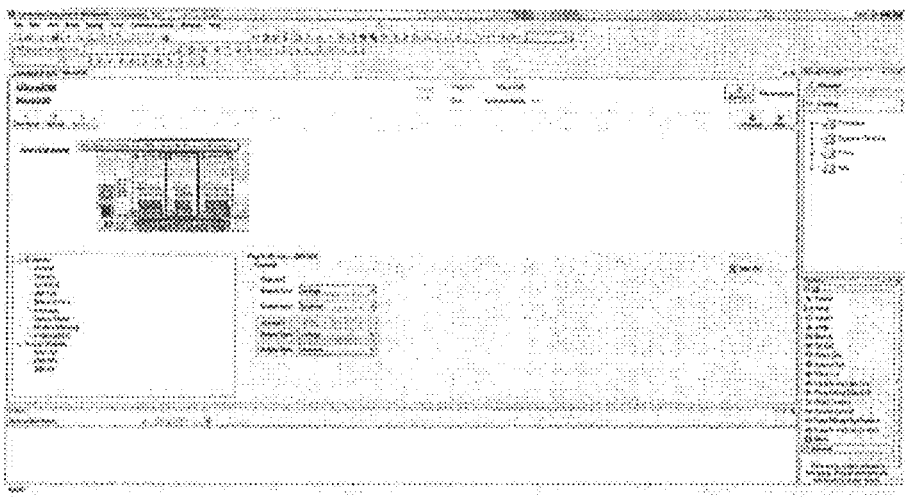
Figure 29: Configuration of 2080-OF2 module

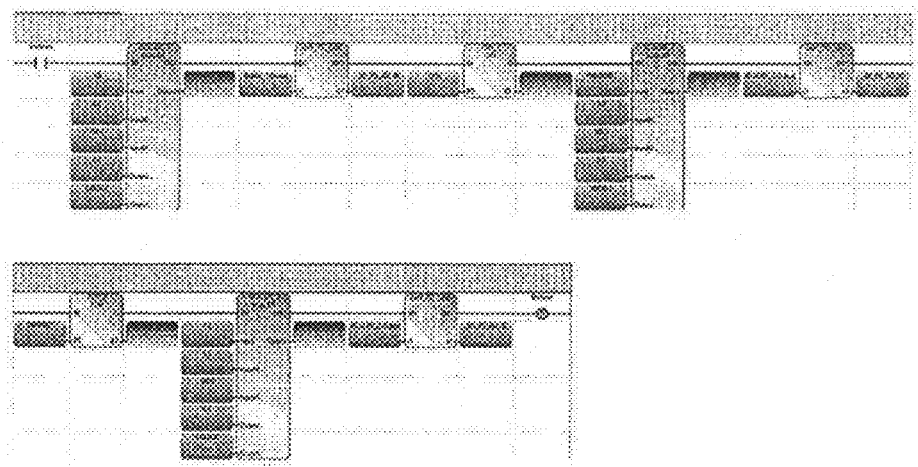
Figure 30: Embossing Ladder Rung
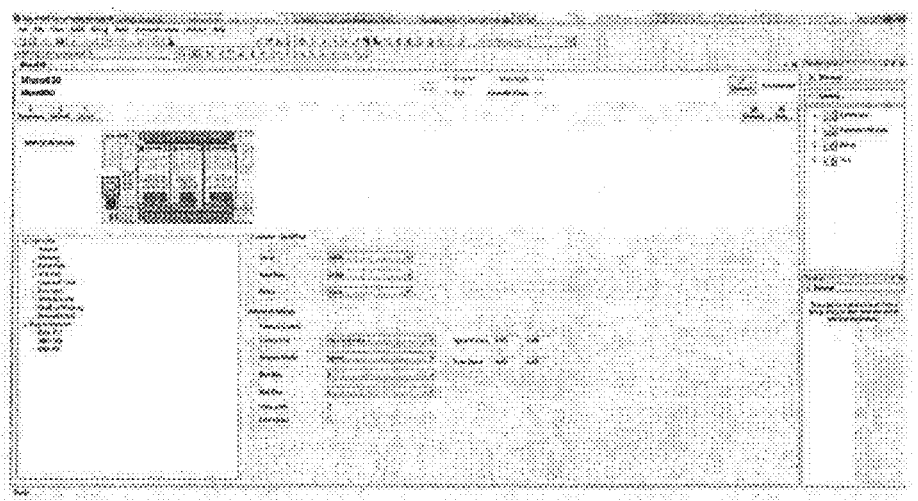
Figure 31: Configuration of onboard serial port

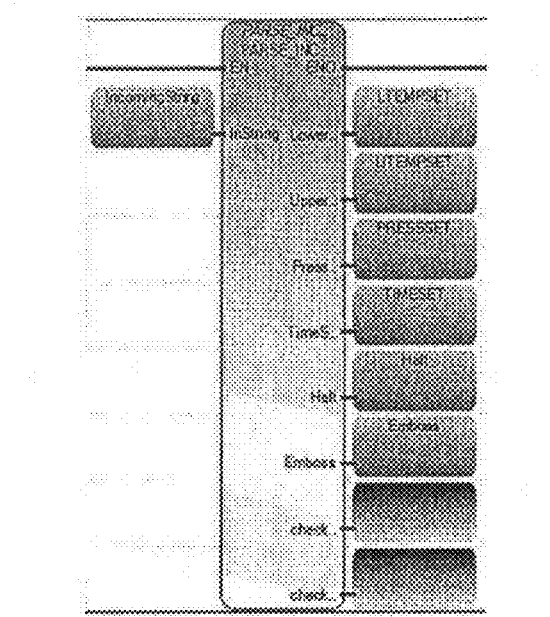
Figure 32: Parse_Incoming_MSG Function Block
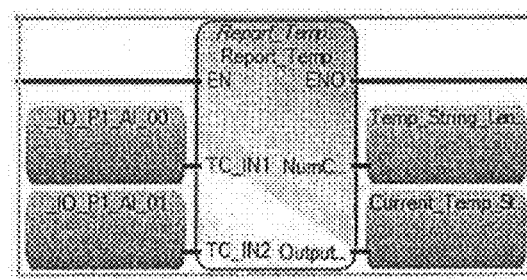
Figure 33: Report_Temp Function Block

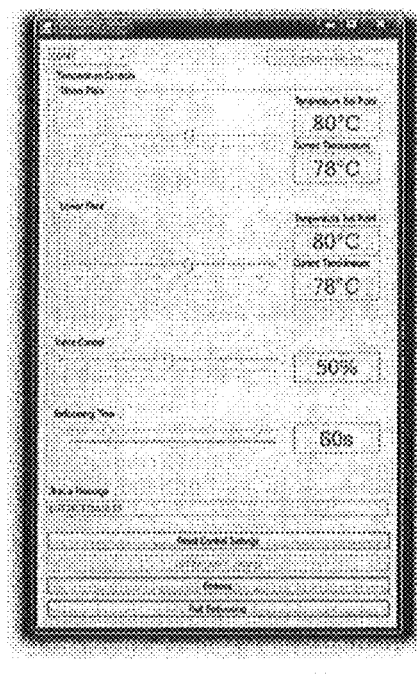
Figure 34: Embosser User Interface

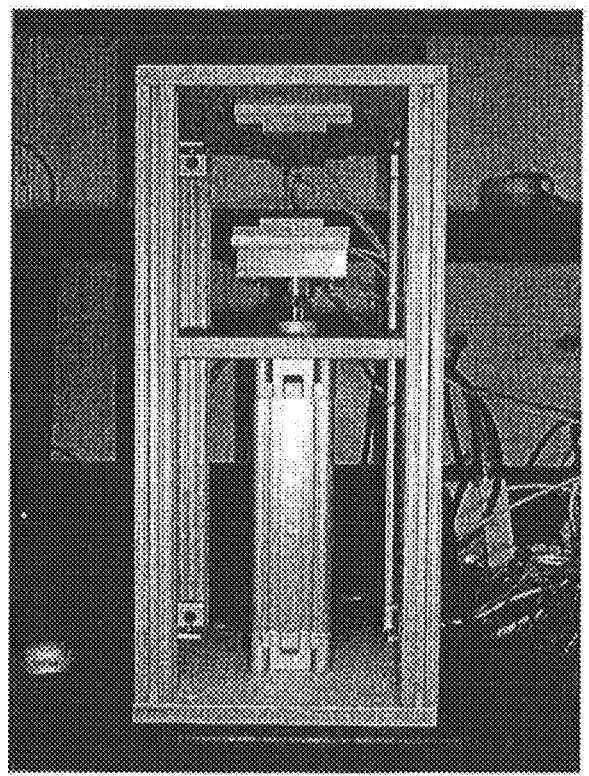
Figure 35: Front View of Completed Embosser

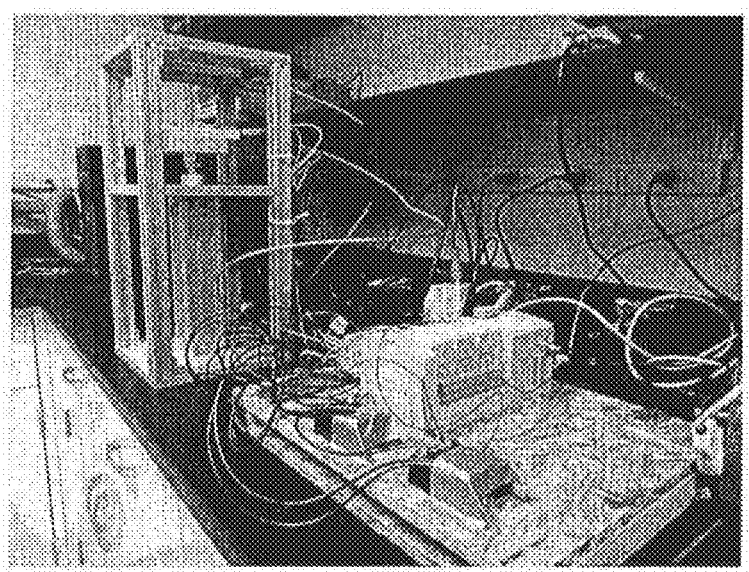
Figure 36: Embosser and Controls during software development

Figure 37: Silk Battery

SILK-BASED NANOIMPRINTING

RELATED APPLICATIONS

This application is a 35 U.S.C. § 371 National Stage Entry of International Application No. PCT/US2014/016630, entitled "SILK-BASED NANOIMPRINTING" and filed on Feb. 14, 2014 and which claims the benefit of and priority to U.S. Provisional Applications 61/765,621, filed Feb. 15, 2013, entitled "IMPROVED SILK-BASED NANOIMPRINTING" and 61/827,544, filed May 24, 2013, entitled "SILK-BASED NANOIMPRINTING," the contents of each of which are hereby incorporated by reference in their entirety herein.

GOVERNMENT SUPPORT

This invention was made with government support under grant W911NF-11-1-0254 awarded by the United States Army. The government has certain rights in the invention.

BACKGROUND

Nanoimprinting is a lithography technique for fabricating micro-, submicro- and nano-scale patterns. In such methods, a mold or template made of such materials as metal, is pressed onto a thermoplastic material, such as silk-based materials, heated above its glass transition temperature, and the softened material conforms to the mold due to applied pressure. Such techniques have been previously described, in for example, WO 2010/126640, entitled "NANOIMPRINTING OF SILK FIBROIN STRUCTURES FOR BIOMEDICAL AND BIOPHOTONIC APPLICATIONS," the entire contents of which are incorporated herein by reference. Such methods already described in the pertinent art typically utilize materials such as metals and silicon as a mold or template (i.e., hard master) to carry out nanoimprinting.

SUMMARY OF THE INVENTION

Among other things, the present application provides improved imprinting methods using silk-based materials, including nano- and micro-scale imprinting. The invention includes novel protein-protein imprinting "PiP" technique for high throughput nanoscale imprinting of silk fibroin films.

The invention is based at least on the recognition that crystallized silk material itself can be effectively used as a template or "master" for carrying out the process of imprinting involving the use of silk materials for imprinting, by differentially controlling material properties of silk fibroin. Accordingly, the methods described herein leverage glass transition temperature (Tg) of silk materials to carry out rapid, high fidelity imprinting capable of achieving high resolution. In some embodiments, resolution of about 100 nm may be achieved.

In some embodiments, a method for nanoscale imprinting of silk fibroin materials (such as films) is provided, in which a nanopatterned silk fibroin film ("master") is used to pattern a second, unpatterned silk fibroin film ("blank"). The imprinting process thus involves the transfer of a pattern (e.g., nanopattern) from the master to the blank, such that a replica of the pattern present on the master can be generated. Pattern transfer from the master to the blank is accomplished by the application of pressure (such as, for example, ~50 Psi) along with heating the blank above the glass transition temperature of the film. In some embodiments, the master is treated prior to imprinting to increase content of the beta-sheet secondary structure motif in the protein by any suitable method. In this way, crystallized and non-crystallized silk materials may be processed differentially by manipulating conditions such as temperature and pressure. This method may also be used to functionalize silk fibroin films for high technology applications in a high-throughput manner.

As described in more detail herein, in some embodiments, the nanoimprinting techniques described herein are suitable for the fabrication of a wide variety of micro- and nanosructures, including, without limitation, photonic structures on silk materials, such as silk films. It was previously shown that is possible to make nanoimprinting on silk films with very high resolution by means of a hard master, such as metal molds used as templates. In some embodiments of the invention, provided methods may employ a hard master for the first imprint, and then an imprinted silk may be used as master for subsequent step(s) of generating positive/negative replicas of nanostructures, such as photonic structure. The possibility of imprinting nonplanar surfaces (e.g., curved or uneven surfaces) with good resolution is also demonstrated, using this technique.

The present application encompasses various embodiments, in which multiple replicas may be generated via serial imprinting. In any of the embodiments, the invention also encompasses the silk based protein-protein imprinting technique that allows for rapid, multi-generation, high-throughput, bench top imprinting applications.

In some embodiments, provided methods are applicable to generating patterning on nonplanar surfaces, including biological substrates, which allows for conformal imprinting.

BRIEF DESCRIPTION OF THE DRAWING

FIG. 13 shows a non-limiting embodiment of a desktop embossing system.

FIG. 14 shows an example of nickel master.

FIG. 15 shows an imprinted silk fibroin film.

FIG. 16 provides an illustration of a non-limiting example of an embossing system, drawn in 3D.

FIG. 17 provides an illustration of an example of a bottom plate that forms the embossing system of FIG. 16 above.

FIG. 18 provides an illustration of an example of a center plate that forms the embossing system of FIG. 16 above.

FIG. 19 provides an illustration of an example of a top plate that forms the embossing system of FIG. 16 above.

FIG. 20 provides an illustration of a front view of the embossing system of FIG. 16 above.

FIG. 21 provides an image of Allen-Bradley Family of PLCs.

FIG. 22 shows an embodiment of a heated-plate design.

FIG. 23 provides a back view of an exemplary heated plate.

FIG. 24 provides a schematic of an embosser control software.

FIG. 25 provides exemplary temperature control rungs.

FIG. 26 shows an exemplary TC2 module selection.

FIG. 27 shows an exemplary configuration of TC2 module.

FIG. 28 shows exemplary OF2 module selection.

FIG. 29 shows exemplary configuration of 2080-OF2 module.

FIG. 30 illustrates an exemplary embossing ladder rung.

FIG. 31 depicts an exemplary configuration of onboard serial port.

FIG. 32 provides an exemplary parse_incoming_MSG function block.

FIG. 33 shows an exemplary report_temperature function block.

FIG. 34 shows an exemplary embosser user interface.

FIG. 35 provides an image of a non-limiting example of a completed embosser (front view).

FIG. 36 provides an image of a non-limiting example of an embosser and controls during software development applications.

FIG. 37 provides an image of a silk battery.

DETAILED DESCRIPTION OF CERTAIN EMBODIMENTS

Control of the interface between biological tissue and high technology materials is paramount for the development of future applications in biomedicine, especially in the case of implantable integrated devices for signal transduction (D.-H. Kim et al., Science 2011, 333, 838-43; D. Kim et al., Nature Materials 2010, 9, 511-517; J. Viventi et al., Nature Neuroscience 2011, 14, 1599-605). Such work requires careful materials design to develop devices that can efficiently perform technological functions while retaining biocompatibility and biological integration.

Silk is a natural protein fiber produced in a specialized gland of certain organisms. Silk production in organisms is especially common in the *Hymenoptera* (bees, wasps, and ants), and is sometimes used in nest construction. Other types of arthropod also produce silk, most notably various arachnids such as spiders (e.g., spider silk). Silk fibers generated by insects and spiders represent the strongest natural fibers known and rival even synthetic high performance fibers. Silk is naturally produced by various species, including, without limitation: *Antheraea mylitta; Antheraea pernyi; Antheraea yamamai; Galleria mellonella; Bombyx mori; Bombyx mandarina; Galleria mellonella; Nephila clavipes; Nephila senegalensis; Gasteracantha mammosa; Argiope aurantia; Araneus diadematus; Latrodectus geometricus; Araneus bicentenarius; Tetragnatha versicolor; Araneus ventricosus; Dolomedes tenebrosus; Euagrus chisoseus; Plectreurys tristis; Argiope trifasciata*; and *Nephila madagascariensis*.

Silk fibroin proteins offer desirable material characteristics for a number of applications that take advantage of the nature of biological materials, such as biocompatibility. Silk fibroin of the *Bombyx mori* silkworm has come of considerable interest in this context, owing to its attractive mechanical (B. D. Lawrence, et al., *Journal of Materials Science* 2008, 43, 6967-6985; S. Sofia et al., *Journal of Biomedical Materials Research* 2001, 54, 139-48; L. Meinel et al., Bone 2006, 39, 922-31; H.-J. Jin et al., Biomacromolecules 2002, 3, 1233-9), biological (M. Santin et al., *Journal of Biomedical Materials Research* 1999, 46, 382-9; E. M. Pritchard et al., *Journal of Controlled Release: Official Journal of the Controlled Release Society* 2010, 144, 159-67), and optical properties (H. Perry et al., *Advanced Materials* 2008, 20, 3070-3072; B. D. Lawrence et al., *Biomacromolecules* 2008, 9, 1214-20) for use in biomedical, optical, electro-optical, industrial and other applications.

Silk Fibroin Processing

Figure 5:
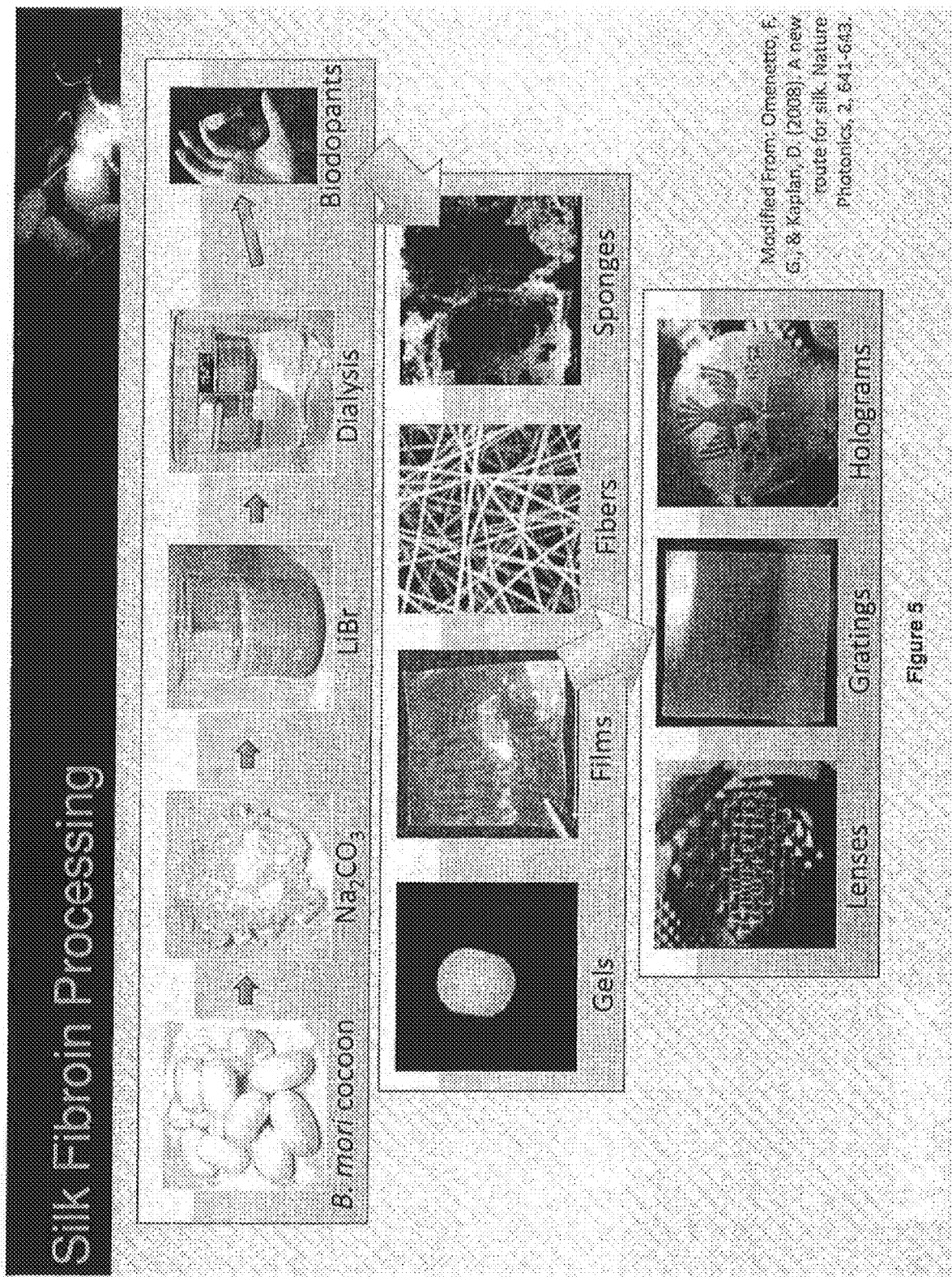
FIG. 5 illustrates certain embodiments of an overall scheme of silk fibroin processing.

An exemplary scheme of silk fibroin processing is outlined in FIG. 5. The process involves silk fibroin protein, known for its biocompatibilty, biodegradability, and biomedical applicability. In some embodiments, regenerated silk fibroin proteins are prepared from natural sources, e.g., cocoons of the mulberry silkworm, *Bombyx mori*. Native silk from cocoons contain both silk fibroin, as well as sericin, which is a glue-like protein that holds the cocoon together. In some embodiments, silk proteins are processed so as to remove the sericin protein in a process generally referred to as "degumming" in order to produce regenerated silk fibroin that is substantially free of sericin.

As used herein, "substantially free of sericin" means that sericin is absent from such a preparation, or present in such a trace amount that it does not affect the subsequent step or steps of silk fibroin processing or its downstream application. In some embodiments, a trace amount of sericin that may be present in a silk fibroin preparation is present in concentrations less than about 0.5%, less than about 0.4%, less than about 0.3%, less than about 0.2%, less than about 0.1%, less than about 0.05%, less than about 0.04%, less than about 0.03%, less than about 0.02%, less than about 0.01%, or lower. In some embodiments, a trace amount of sericin that may be present in a silk fibroin preparation is present in a concentration that is below a detectable threshold by conventional assays used in the art.

The degumming process typically involves boiling of cocoon samples under an alkaline condition, such as in a sodium carbonate solution, to remove the sericin. Following that step, the water-insoluble fibers are first dried, and then dissolved in a solution, such as a lithium bromide solution. Silk fibroin in the lithium bromide solution is then typically dialyzed in water. Dialysis removes the salt, resulting in an aqueous solution of silk fibroin. In some embodiments, aqueous solution of silk fibroin prepared this way contain between about 4-10% of pure silk fibroin, e.g., about 4%, about 4.5%, about 5%, about 5.5%, about 6%, about 6.5%, about 7%, about 7.5%, about 8%, about 8.5%, about 9%, about 9.5%, about 10% of silk fibroin. Typically, such aqueous solution contains about 5-7%, for example, about 6% of silk fibroin.

In some embodiments, one or more dopants (e.g., active agents), such as biodopants, may be added to silk fibroin preparations, which can provide additional functionality, visa vie sensing capability or structural support. For example, silk fibroin solution containing at least one dopants can then be processed via various methods into desirable formats, such as gels, films, fibers, sponges, meshes, particles, and the like. In some embodiments, we focused on silk films, which can be further processed, and micro- or nanofabrication steps can convert them into useful devices, including optical components, e.g., lens arrays, gratings, and holograms.

Protein Micro/Nanofabrication with Silk

Figure 6:
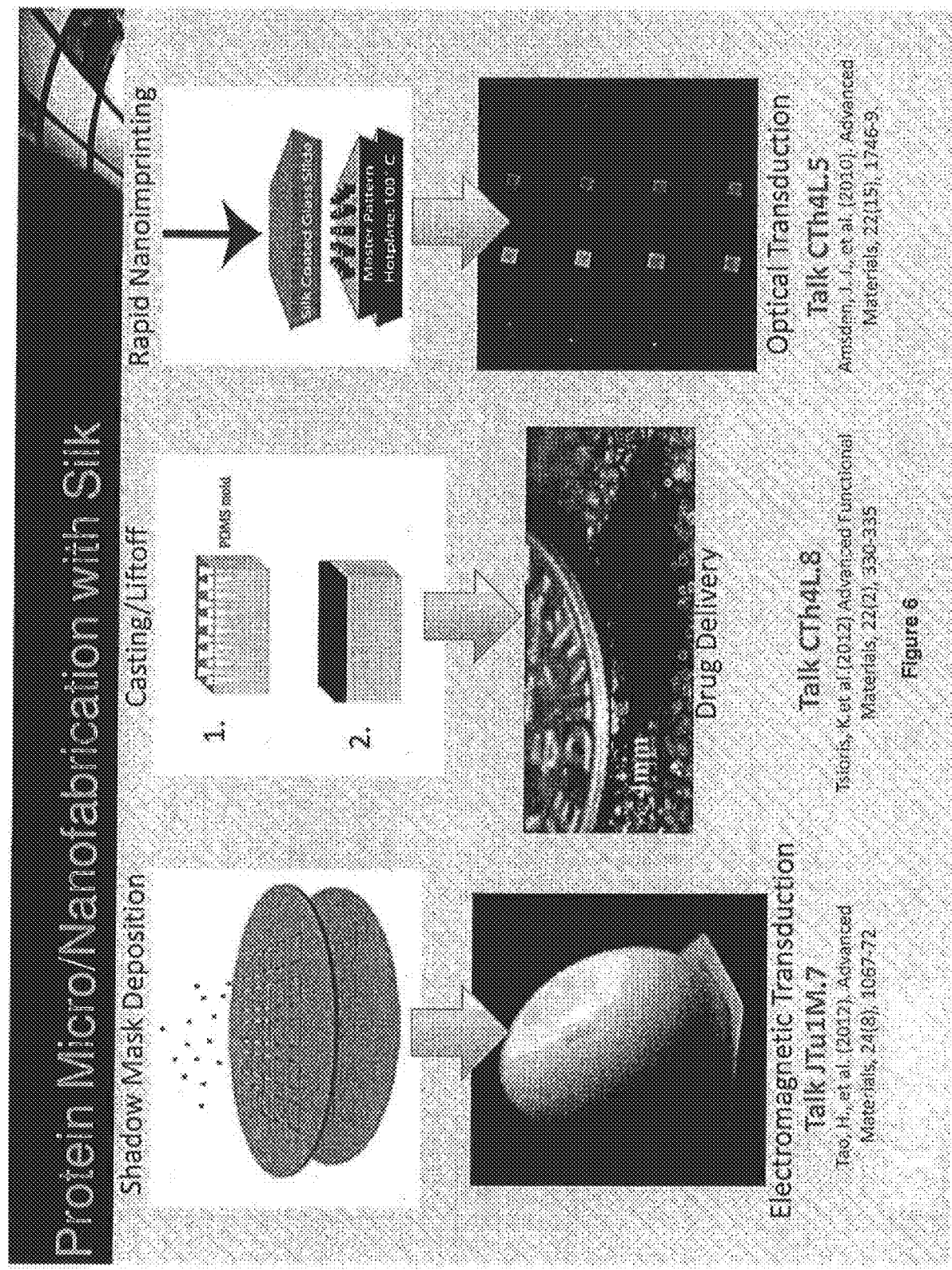
FIG. 6 provides schematics of protein micro- and nanofabrication. Left: the "shadow mask deposition" technique; center: the "casting and lift-off" technique using a mold; and right: "rapid nanoimprinting" technique.

A variety of useful applications are contemplated. For example, within this family of microfabrication tools reported in the literature (see FIG. 6), we have the means of providing a number of additional functionalities. For example, by using shadow mask deposition, we can sputter metals on to films, for transferable metamaterial sensors. By adding pharmaceutical dopants and then casting on molds, such as soft PDMS-based molds, we can fabricate microneedle arrays for transdermal drug delivery with continuous release profiles. And, by pressing a hard nanopatterned silicon or glass master into a silk film with the application of heat, we can generate micro and nanoscale features, such as these photonic crystal structures as shown in the FIG. 6. Functionally, these structures may act as optical transducers for biosensing applications.

As described herein, the present invention extends and greatly improves both fabrication processes and end use applications by improved nanoimprinting methodology.

Rapid Nanoimprint Lithography

The inventors of the present application have recognized that, the process of imprinting is intimately affected by, and even a direct result of, the variable glass transition temperature, or Tg, of silk materials. Moreover, the inventors have recognized that the process also depends on their water content. The illustration provided in the upper left side of FIG. 7 under this subsection is intended to represent the secondary structure of the silk protein films, containing random coil, alpha-helix, and beta-sheet motifs (e.g., secondary structures), along with bound and unbound water molecules. An air-dried film, as on the left panel, will contain a mixture, with extensive random coil and beta sheet motifs, as well as considerable water content. Inducing crystallization of silk fibroin (e.g., annealing) will cause an increase in the beta sheet motifs, and a corresponding decrease in water content, as unbound, and then bound water are pushed out of the film creating crystalline domains. In some embodiments, annealing involves contacting a silk fibroin material with an organic solvent or an alcohol, including but are not limited to: methanol, ethanol, isopropanol, acetone, or any combination thereof. In some embodiments, annealing involves water-vapor annealing. In some embodiments, annealing can be induced by submerging a silk fibroin material (such as film) in a methanol solution to induce crystallization of silk fibroin, such that there is an increased level of beta-sheet content in the fibroin protein.

Figure 7:
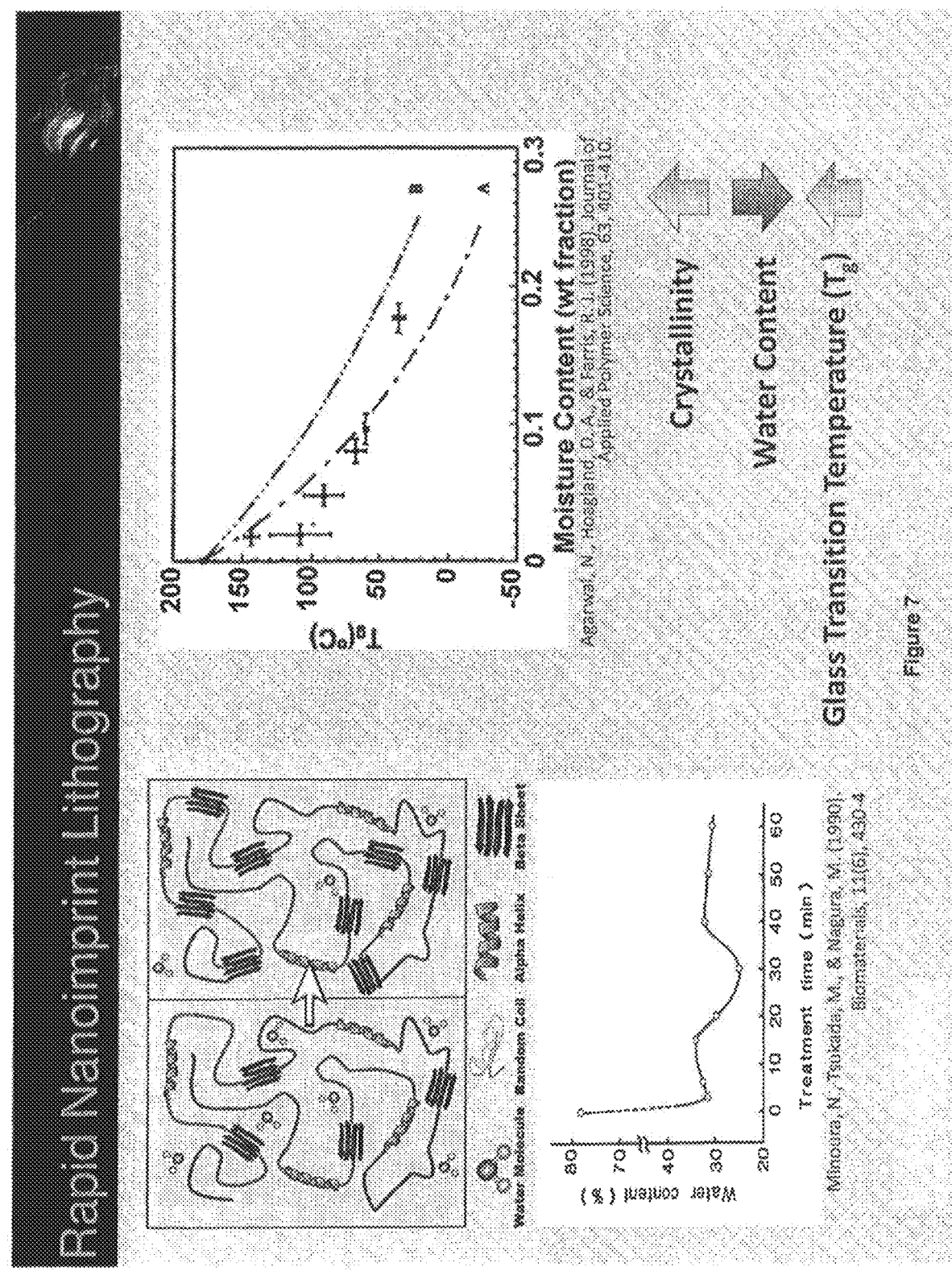
FIG. 7 depicts general relationship between crystallinity, water content and glass transition temperature, as applied to the rapid nanoimprint lithography technique.

This is also exemplified on the graph shown in the lower left side of FIG. 7, where, in this case, treatment time is time treated with a 50% methanol solution. As the graph on the right shows, the silk film Tg can exist anywhere from 50° C. to 150° C., depending on the water content, with a lower Tg corresponding to a higher water content. In some embodiments, silk fibroin Tg is, for example, about 50° C., about 55° C., about 60° C., about 65° C., about 70° C., about 75° C., about 80° C., about 85° C., about 90° C., about 95° C., about 100° C., about 105° C., about 110° C., about 115° C., about 120° C., about 125° C., about 130° C., about 135° C., about 140° C., about 145° C., about 150° C. Below their glass transition temperatures, silk films form hard glassy structure, and above they will be in a pseudo-liquid state. It has been recognized that this is the crucial transition that may be used to leverage to imprint. In some embodiments, water content of a silk fibroin material (such as silk fibroin film), as measured by weight percentage, is between about 1% and 35%, e.g., about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%. In some embodiments, water content of a silk fibroin material, as measured by weight fraction, is below 0.2, for example, below 0.1.

Figure 8:
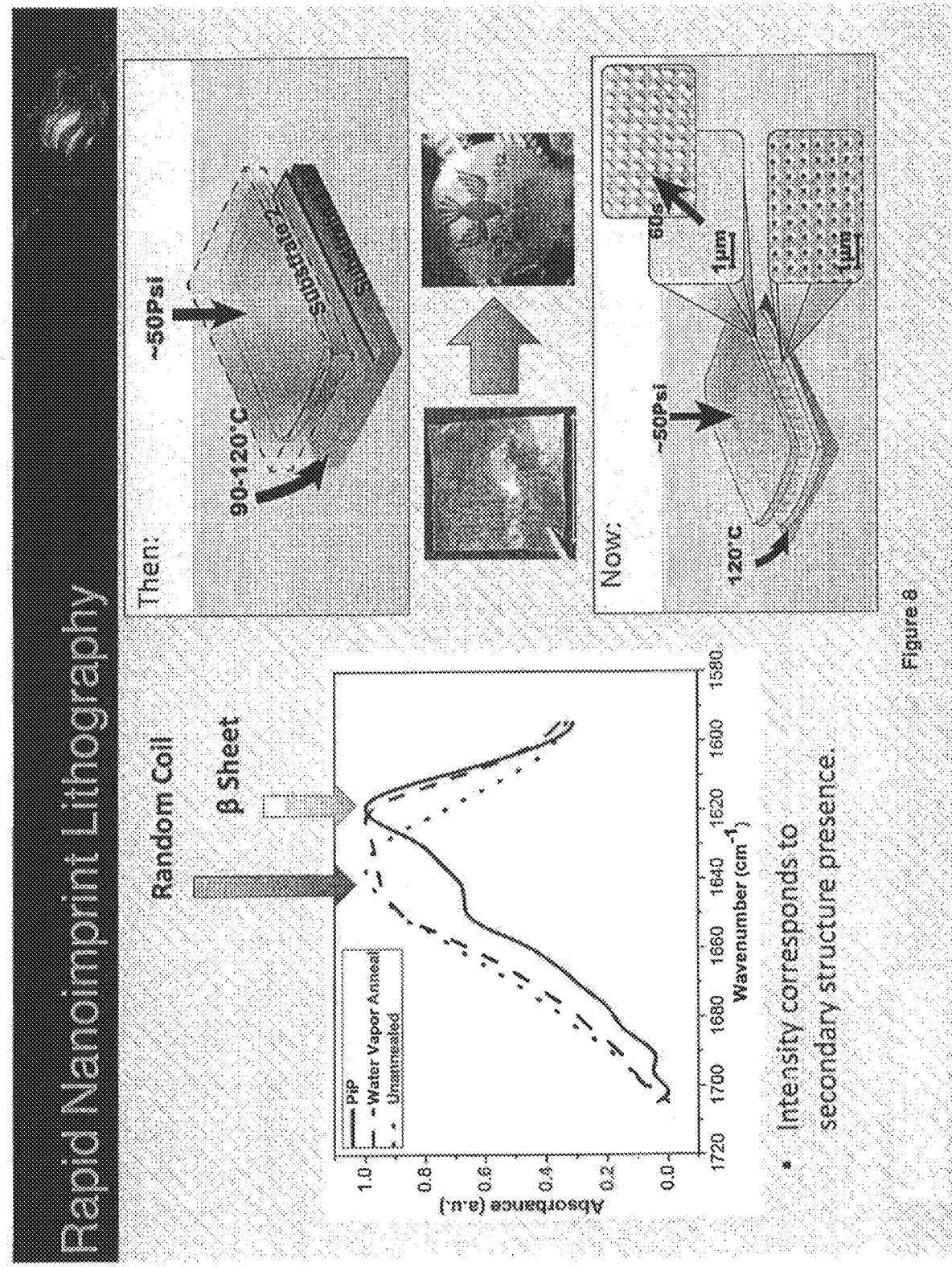
FIG. 8 provides a graph showing structural relationship of random coil and beta-sheet silk fibroin as applied to improved nanoimprinting lithography.

In some embodiments, the rapid imprint lithography technique described herein may take advantage of rapid, high temperature treatment (heating) to trigger robust crystallization of silk fibroin (FIG. 8). In some embodiments, suitable heating is carried out at temperature of between about 80-140° C., e.g., between about 85-135° C., between about 90-130° C., between about 95-125° C., between about 100-130° C., between about 105-125° C., between about 110-125° C., between about 115-125° C., between about 116-124° C., between about 117-123° C., between about 118-122° C., between about 119-121° C. In some embodiments, heating is carried out at about 120° C., e.g., about 110° C., about 111° C., about 112° C., about 113° C., about 114° C., about 115° C., about 116° C., about 117° C., about 118° C., about 119° C., about 120° C., about 121° C., about 122° C., about 123° C., about 124° C., about 125° C., about 126° C., about 127° C., about 128° C., about 129° C., about 130° C.

In some embodiments, heating is carried out for a period of time sufficient to induce crystallization (or beta-sheet formation) in silk fibroin. Suitable durations in this context depend, but in some embodiments, heating is carried out for about 1 second, about 2 seconds, about 3 seconds, about 4 seconds, about 5 seconds, about 6 seconds, about 7 seconds, about 8 seconds, about 9 seconds, about 10 seconds, about 11 seconds, about 12 seconds, about 13 seconds, about 14 seconds, about 15 seconds, about 16 seconds, about 17 seconds, about 18 seconds, about 19 seconds, about 20 seconds, about 21 seconds, about 22 seconds, about 23 seconds, about 24 seconds, about 25 seconds, about 26 seconds, about 27 seconds, about 28 seconds, about 29 seconds, about 30 seconds, about 31 seconds, about 32 seconds, about 33 seconds, about 34 seconds, about 35 seconds, about 36 seconds, about 37 seconds, about 38 seconds, about 39 seconds, about 40 seconds, about 41 seconds, about 42 seconds, about 43 seconds, about 44 seconds, about 45 seconds, about 46 seconds, about 47 seconds, about 48 seconds, about 49 seconds, about 50 seconds, about 51 seconds, about 52 seconds, about 53 seconds, about 54 seconds, about 55 seconds, about 56 seconds, about 57 seconds, about 58 seconds, about 59 seconds, about 60 seconds, about 61 seconds, about 62 seconds, about 63 seconds, about 64 seconds, about 65 seconds, about 66 seconds, about 67 seconds, about 68 seconds, about 69 seconds, about 70 seconds, about 71 seconds, about 72 seconds, about 73 seconds, about 74 seconds, about 75 seconds, about 76 seconds, about 77 seconds, about 78 seconds, about 79 seconds, about 80 seconds, about 81 seconds, about 82 seconds, about 83 seconds, about 84 seconds, about 85 seconds, about 86 seconds, about 87 seconds, about 88 seconds, about 89 seconds, about 90 seconds, or longer.

To illustrate, as the FTIR spectra on the right show, heating the film to 120° C. for 60 seconds as in PiP causes a decrease in the random coil band at 1650 wavenumbers and an increase in the beta sheet band at 1620 wavenumbers of the Amide I region of the spectra. Compared to a more "gentile" crystallization technique, this rapid transition drives water out, causing reflow, and then as the Tg rises further, locks the pattern in to place via film crystallization. The improvement came in the realization that a crystallized patterned film with a high Tg is equivalent to a metal master for silk imprinting purposes used in previous work. With this recognition, it was possible to take advantage of the Tg difference, to use one silk film (master) to imprint another (blank). The imprinting film (e.g., master), never reaching its Tg will act as a solid mold for the imprinted film, which will need to be heated past the transition point, which can be accomplished on the bench top. This novel concept not only eliminated the requirement of expensive and fragile metal or silicon master, but also brought about a whole new avenue of simple yet elegant processing methods with additional benefits not available in conventional imprinting methodology.

Accordingly, in some embodiments of the invention, a composition comprising a first silk fibroin material comprising a predetermined nanostructure thereon is provided, in which the first silk fibroin material has a first beta sheet content and a first glass transition temperature ($T_{g1}$); a second silk fibroin material, having a second beta sheet content and a second glass transition temperature ($T_{g2}$); and, wherein the first silk fibroin material is in close contact with the second silk fibroin material, such that the predetermined nanostructure on the first fibroin material is substantially replicated onto the second silk fibroin material to produce an inverse imprint of the predetermined nanostructure. In some embodiments, wherein the inverse imprint of the predetermined nanostructure has a resolution of at least 100 nm, at least 250 nm, at least 200 nm, at least 300 nm.

In some embodiments, the invention provides a composition comprising a first silk fibroin material comprising a predetermined nanostructure fabricated thereon; wherein the first silk fibroin material has a first water content and a first glass transition temperature ($T_{g1}$); a second silk fibroin material, having a second water content and a second glass transition temperature ($T_{g2}$); wherein the first silk fibroin material is in close contact with the second silk fibroin material, such that the predetermined nanostructure on the first fibroin material is substantially replicated onto the second silk fibroin material to produce an inverse imprint of the predetermined nanostructure. In some embodiments, wherein the inverse imprint of the predetermined nanostructure has a resolution of at least 100 nm, at least 250 nm, at least 200 nm, at least 300 nm.

PiP Characterization

This additional benefit comes from the recognition that since any silk film can become a master, each film can give rise to a subsequent generation of replica films, and so one imprint from a fabricated master can potentially be amplified into a very large number of films in the fashion of a binary tree. In other words, the use of silk in this way makes it possible for serial imprinting, while preserving high fidelity.

In the context of the present disclosure, the preservation of high fidelity refers to the ability of replicating the structure (i.e., pattern) of a master plate/film onto a blank (e.g., a second film) such that the structural features are accurately reproduced onto the blank to create a mirror image (i.e., inverse) of the master pattern. Similarly, such step may be repeated for serial imprinting without losing structural features being replicated at each round, in a way sufficient to serve the purpose or function of interest. Furthermore, in some embodiments, high fidelity may also refer to the ability to generate replicas which are structurally and functionally equivalent of one another. For example, fidelity is said to be the highest when one positive imprint is identical to a second positive imprint, and one negative imprint is identical to a second negative imprint, while each of the positive imprints is the exact mirror image of each of the negative imprints.

Accordingly, in some embodiments, the invention provides a composition comprising a plurality of negative silk fibroin imprints and a plurality of positive silk fibroin imprints. In some embodiments, a positive silk fibroin imprint of such compositions comprises a nanopattern, and a negative silk fibroin imprint of such compositions comprises an inverse of the nanopattern present on the positive silk fibroin imprint. In some embodiments, such negative silk fibroin imprints are substantially identical replicas of one another, and such positive silk fibroin imprints are substantially identical replicas of one another. As used herein, "substantially identical replicas" mean that such structures are sufficiently similar that they serve equivalent function for intended purposes. As an example, such a structure may comprise an array of photonic crystal that causes structural colors. Nanopatterns of such photonic crystals created by the PiP technique described in this application, for example by serial imprinting, are said to be substantially identical replicas of one another if each resulting nanopatterned film is able to reproduce visibly same or similar structural color or colors.

Figure 9:
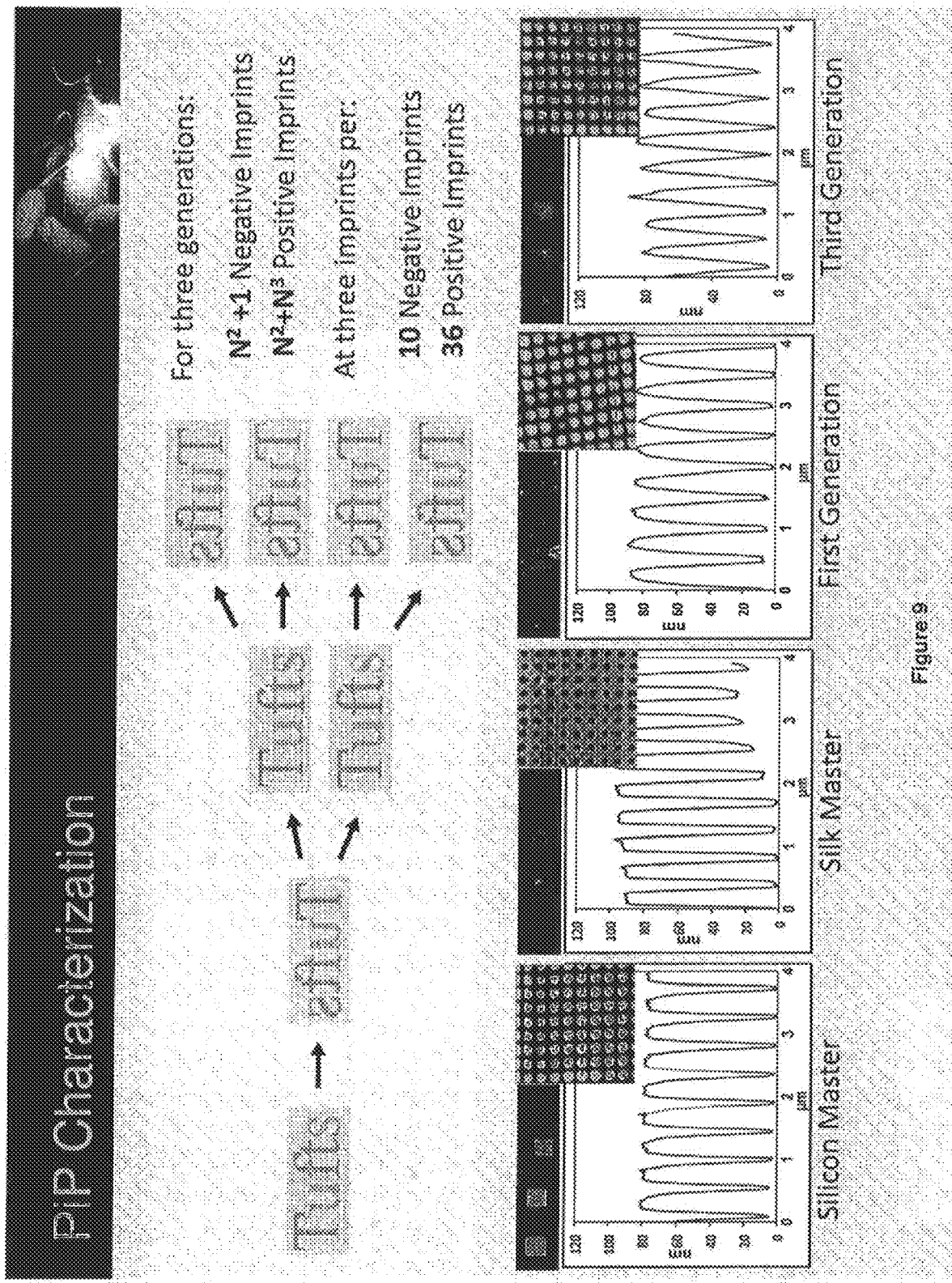
FIG. 9 provides schematics of protein-protein imprinting ("PiP").

As a first step in testing this phenomenon, an initial silk master was taken and was used to create three generations of imprints. As shown in FIG. 9, the optical, 2D Atomic force microscopy, and representative AFM cross-sections are provided. With each subsequent cycle (or generation), an increase in the sharpness of the peaks can be noted, although it is important to keep in mind the relative scales of the axes, so the holes are not as sharp as they appear. Remarkably, though, a marked decrease in hole depth across generations was not seen, which led to comparable intensity for all samples tested. A simple calculation provides the following: assuming a maximum of three generations, N squared+1 and N squared plus N cubed negative and positive imprints respectively can be generated. If a modest assumption that three imprints per generation is made, this results in 10 negative and 36 positive imprints from a single master use.

As should be clear from the illustration in FIG. 9, the terms positive and negative imprints denotes mirror image relationship to each other, such that if a master pattern is deemed a positive imprint, an imprint made from the master pattern would have its mirror image, or negative imprint, and so on. And a second imprint made from the same master pattern would also be a negative imprint, or a replica of the first imprint made from the master pattern.

With this in hand, further characterization of the technique was performed, both for optimizing the imprint quality for desirable conditions, and for investigating and verifying the limits of the system. With the use of a constant level of pressure, a 500 nm thick silk film with Tufts written in it using photonic crystal structures of varying lattice constant, was used as a master (as shown in FIG. 9) for imprinting. The temperature was varied between 70 and 120° C., and the time (i.e., duration) was tested between zero and 60 seconds.

Figure 10:
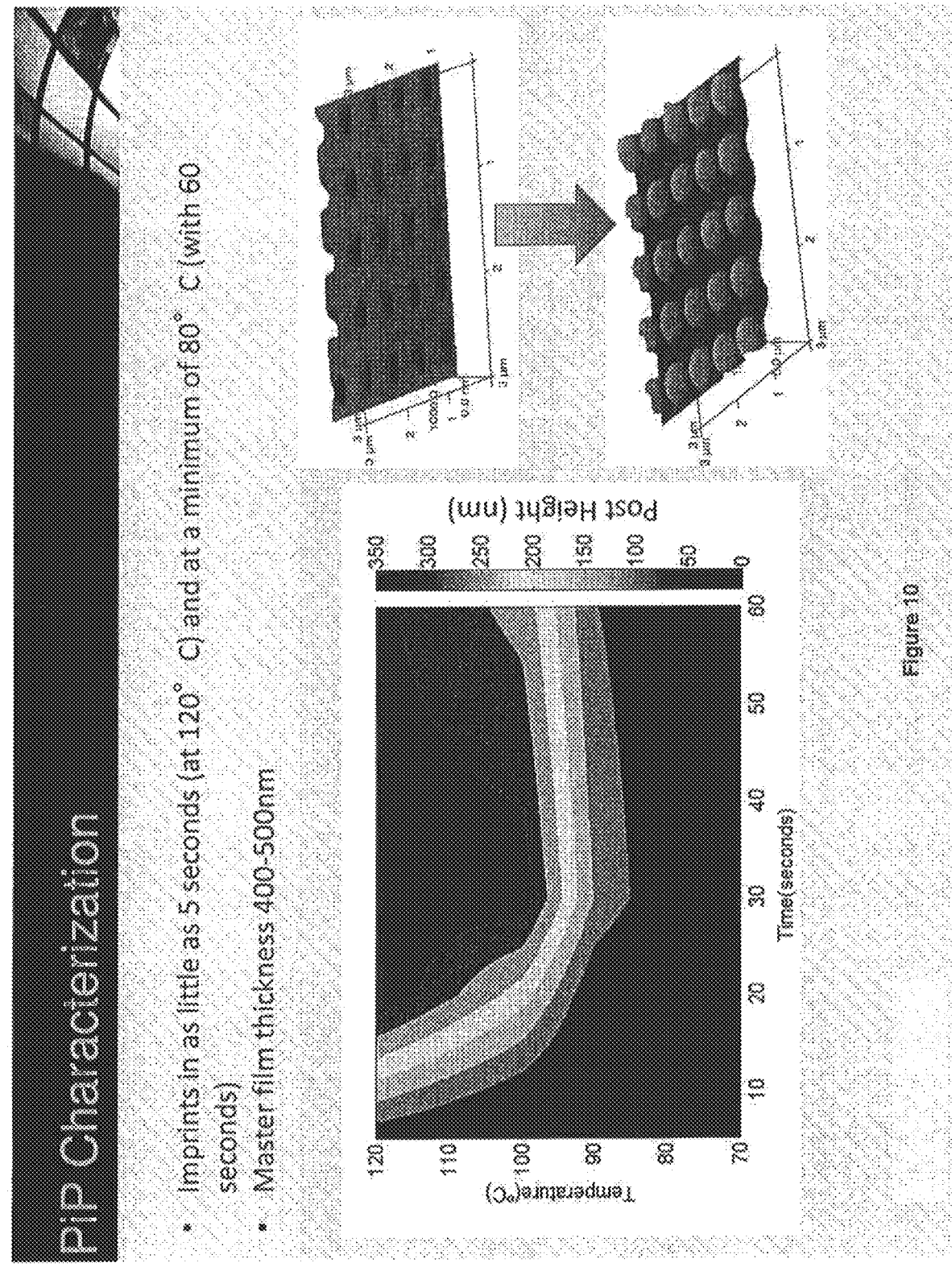
FIG. 10 shows temperature- and time-dependent nanoimprinting.

The FIG. 10 provides an interpolated contour plot of the results, showing the average post height of the imprints, as per the AFM images on the right, over tested conditions. These results are film thicknesses, and hydration states tested, but show a general trend of optimization, with the best results at intermediate times and temperatures. This makes logical sense, as adding additional heat will dry the film quicker, pushing up the Tg faster, and decreasing the amount of time for reflow, and short times will not allow sufficient time for reflow. It appears that at least under these conditions, all silk reflow occurs with the first 30-40 seconds, since there is little change with time after this point, and so further heating is unnecessary.

Figure 11:
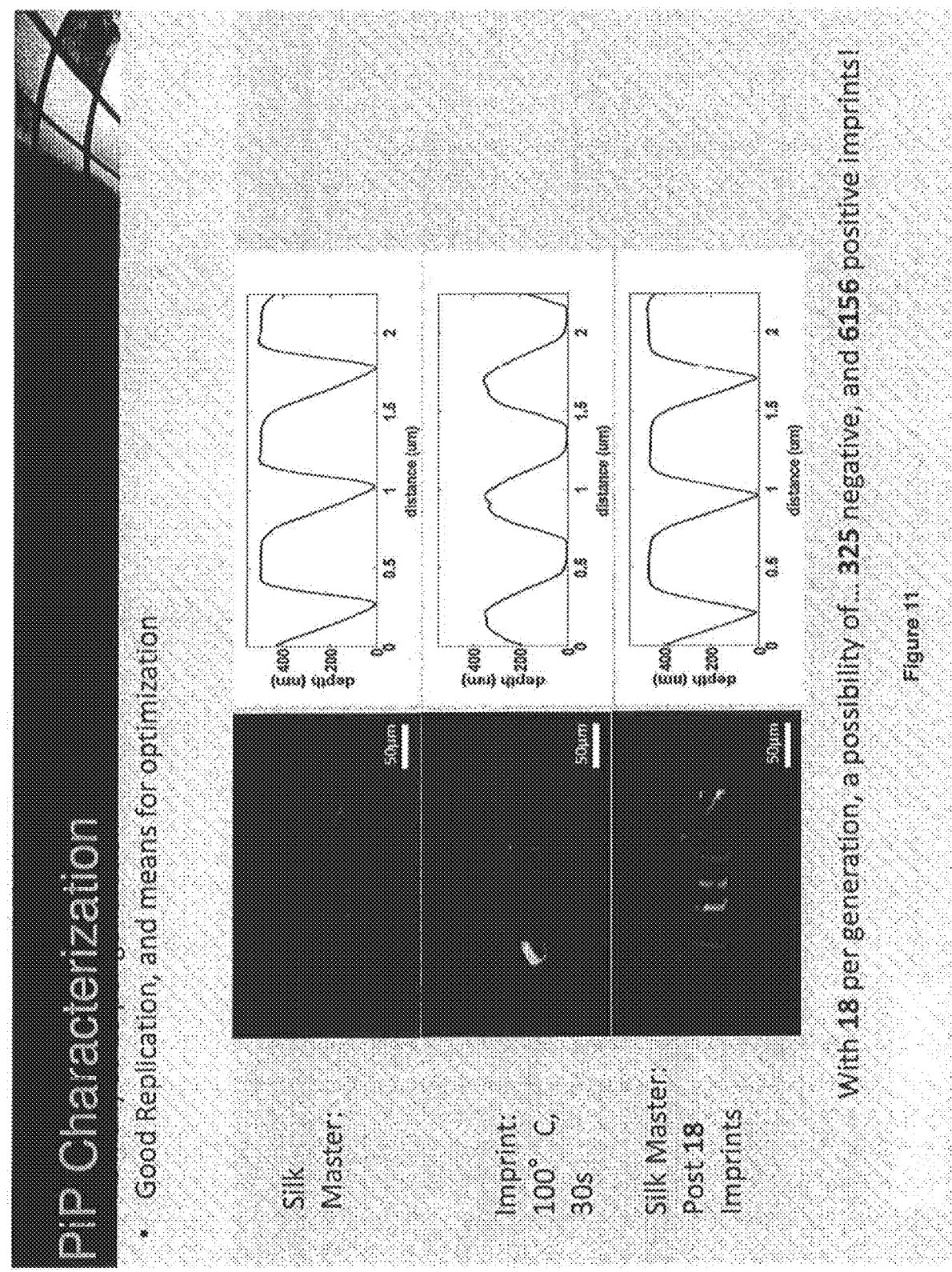
FIG. 11 shows PiP replication of imprints using a silk fibroin master film.

Upon reviewing representative images and cross sections of these characterization tests, both in optical response and cross section, it is clear that the two dimensional and optical replication were both strong. The cross sections in this non-limiting example are taken from the "T" in Tufts (FIG. 11). Furthermore, the silk master was able to withstand 18 imprints without considerable loss in quality, demonstrating that high fidelity is effectively maintained after a number of cycles of serial imprinting. Applying this to our calculation from before, in three generations, 325 negative and 6,156 possible positive imprints can be generated from the use of a single master.

Extensions and Applications

Figure 12:
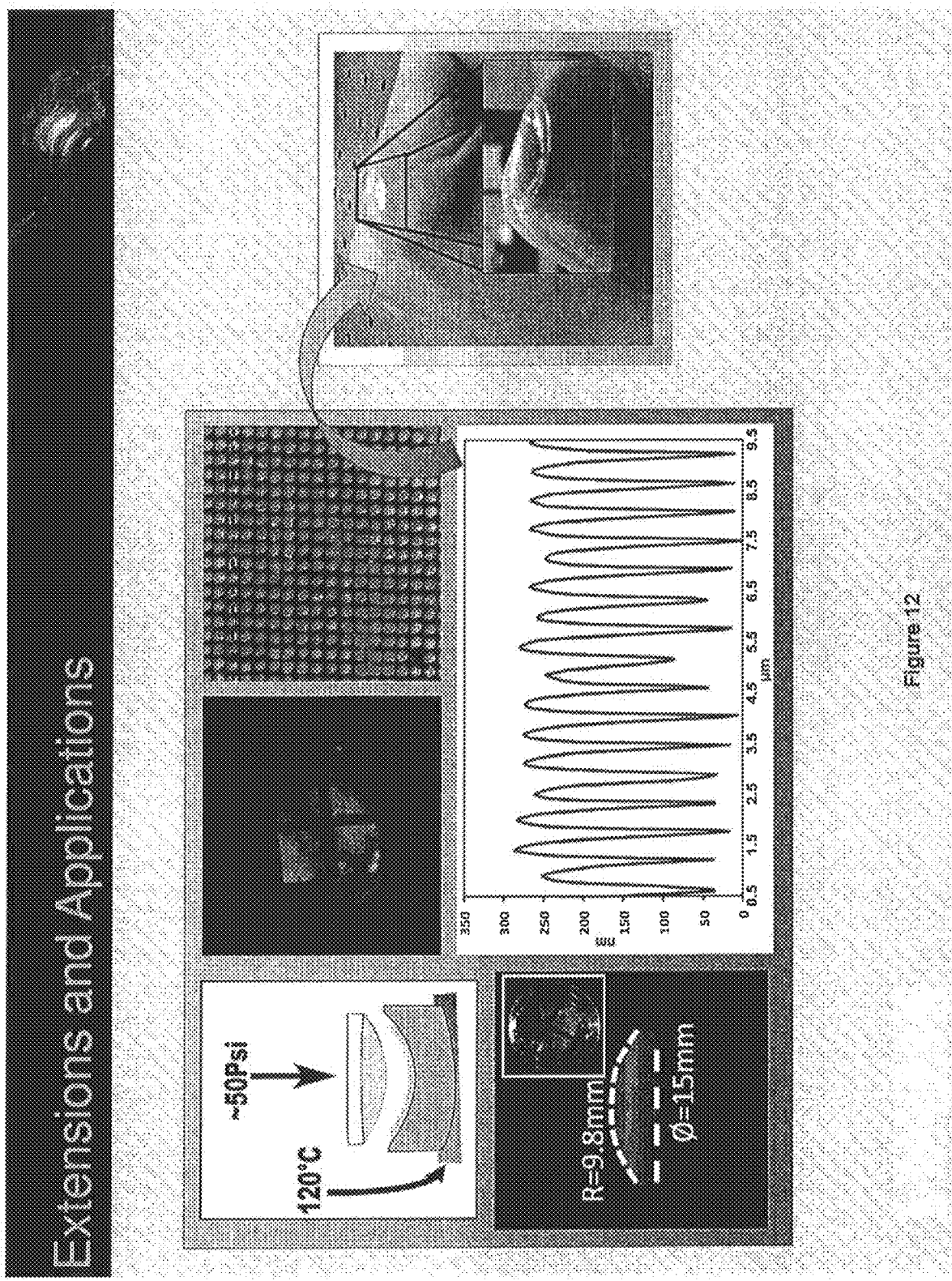
FIG. 12 shows non-limiting applications of the PiP technique.

However, the advantages of the PiP method extend beyond rapid, high-throughput nanoscale fabrication. The FIG. 12 provides, in blue, how this technique could be applied to imprint directly onto curved surfaces, due to the flexible nature of the silk films utilized. With the addition of a simply machined aluminum piece to apply pressure normal to the curved surface, we were able to imprint this 3,600 dots/mm 2D grating structure on the surface of a small Plano convex spherical lens with a diameter 15 mm, radius of curvature 9.8 mm, and 30 mm focal length. The combination of diffractive features on a refractive device could be useful for spectrophotometric and beam manipulation applications. The completed construct was able to select orders of light, and showed good replication in all three dimensions. Pulling back the transfer techniques applied to the electromagnetic transduction mechanisms in the introductory slides, this technique now shows promise for the application of optical transduction mechanisms to biomedically relevant surfaces.

To summarize, the protein-protein imprinting method described here leverages the variable glass transition temperature of silk fibroin films to imprint with approximately 100 nm resolution. In some embodiments, the methods described herein can achieve resolution of about 500 nm, about 450 nm, about 400 nm, about 350 nm, about 300 nm, about 250 nm, about 200 nm, about 150 nm, about 100 nm, or higher. This allows for rapid, high throughput multi-generation imprinting, over at least 3 generations with at least 18 imprints per generation. Such imprinting can be carried out on films as thin as 500 nm or less, with temperatures as low as 80° C. or less, and durations of time as short as a few seconds. Combined with conformal imprinting, this technology can be of help to work towards increasing the range of applications for nanoscale fabricated transducers, processed only in water.

EXEMPLIFICATION

The working examples are presented for illustrative purposes only, and the embodiments described herein are not construed to be any way limiting. For detailed disclosures of related art, see, for example, WO 2008/127404, WO 2008/118211, WO 2008/127402, WO 2008/127403, WO 2008/127401, WO 2008/140562, WO 2008/127405, WO 2009/061823, WO 2009/155397, WO 2010/126640, WO 2011/046652, WO 2011/026101, WO 2011/160098, WO 2012/054121, WO 2011/115643, WO 2011/130335, WO 2011/112931, WO 2012/047682, WO 2012/031282, WO 2012/094436, WO/2012/145739, WO 2010/088585, the contents of each of which are incorporated herein by reference.

Example 1: Protein-Protein Imprinting (PiP): High Throughput Nanoscale Imprinting of Silk Fibroin Films for Photonics Recent work has shown adaptation of common micro- and nano-fabrication tools to silk films (R. D. White et al., *Journal of Micromechanics and Microengineering* 2011, 21, 115014; K. Tsioris et al., *Advanced Materials* 2011, 23, 2015-9; K. Tsioris et al., *Advanced Functional Materials* 2010, 20, 1083-1089; J. P. Mondia et al., *Advanced Materials* 2010, 22, 4596-9; H. Tao et al., *Advanced Materials* 2011, 23, 3197-201), leading to biocompatible and degradable electronic and photonic devices which can simultaneously act as a carrier and stabilizer for protein pharmaceuticals and other bioactive reagents (J. Zhang et al., *Proceedings of the National Academy of Sciences of the United States of America* 2012; K. Tsioris et al., *Advanced Functional Materials* 2012, 22, 330-335; H. Tao et al., *Advanced Materials* 2012, 24, 2824-37; P. Domachuk et al., *Applied Physics Letters* 2009, 95, 253702). In particular, silk based nanoscale photonic devices face the challenge of sub-wavelength resolution fabrication on a soft polymeric substrate (J. P. Mondia et al., *Advanced Materials* 2010, 22, 4596-9; S. Y. Lee et al., *Proceedings of the National Academy of Sciences of the United States of America* 2010, 107, 12086-90). Previous work introduced the possibility of direct, rapid nanoimprinting in silk for the fabrication of photonic structures by leveraging the material properties of this protein (J. J. Amsden et al., *Advanced Materials* 2010, 22, 1746-9).

In this context, the glass transition temperature ($T_g$) of the protein is a parameter of particular relevance. In a silk film dried under ambient conditions, the water retained by the film acts as a plasticizer, significantly lowering the glass transition from 178° C. to ~78° C. (X. Hu et al., *Thermochimica Acta* 2007, 461, 137-144). The actual $T_g$ depends inversely on the water content and can be modeled as a function of the fractions of silk and water in the dried construct (N. Agarwal et al., *Journal of Applied Polymer Science* 1998, 63, 401-410). In imprinting, the application of heat and pressure to a silk fibroin film layered on a hard mask rapidly pushes the film above $T_g$, causing it to transition from a glassy state to a liquid-like rubber, allowing reflow of polymer on the nanoscale (J. J. Amsden et al., *Advanced Materials* 2010, 22, 1746-9).

In this work, we expand upon this technique by exchanging the conventionally fabricated hard silicon or glass masters with a second silk fibroin film, in a process we term protein-protein imprinting (or PiP for short). This is accomplished by control of the water content and beta-sheet crystallinity of each of the two films. Though the heat and pressure application are similar to the previous technique, using a dry, crystallized fibroin master and a wet, uncrystallized "blank" film allows for reflow of the template film only and limits the adhesion between the two layers for easy release. As an improvement to the current technique, this method significantly increases throughput, reduces dependence on the hard mask, and, additionally, allows for direct conformal imprinting on curved surfaces due to the flexibility of the nanoimprinted silk master.

Nanoimprint lithography on nonplanar surfaces has been investigated recently for applications in spectroscopy (Y. Xie et al., *Optics Express* 2003, 11, 992-5), superhydrophobic structures (L. Mishchenko et al., *ACS Nano* 2010, 4, 7699-7707), and microlens arrays (K. Hoshino et al., IEE Conference on Micro-Electro Mechanical Systems 1999, 429-434; H. O. Jacobs et al., *Science* 2002, 296, 323-5), and has shown resolution on the order of ~100 nm. Here, a wide variety of approaches have been attempted, ranging from nanoimprint lithography with flexible materials to chemical vapor deposition assisted methods. Most of these currently available techniques suffer from complex procedures or destruction of the imprint master (W. M. Choi & O. O. Park, *Nanotechnology* 2004, 15, 1767-1770; R. Mukherjee et al., *Industrial Engineering Chemical Research* 2009, 8812-8818; B. Farshchian et al., *Microelectronic Engineering* 2011, 88, 3287-3292). The required photoresists and imprinted materials are often not biocompatible, limiting their use in biomedical applications (B. Farshchian et al., *Microelectronic Engineering* 2011, 88, 3287-3292). Furthermore, most of those processes are relatively time consuming, with a required imprinting duration ranging from a few minutes to several hours. For example, a common conformal printing technique using thin poly(dimethylsiloxane) (PDMS) membranes usually requires ~5 min imprint times for a resolution of ~500 nm, and lacks long term repeatability due to master deformation after repeated heating for the long imprinting time (W. M. Choi & O. O. Park, *Nanotechnology* 2004, 15, 1767-1770). Further, none of these prior approaches provides facile modes to incorporate bioactive components with retention of function, a feature that permits broader utility in medical devices and other domains.

For the application of PiP to nonplanar surfaces we demonstrate resolution on the order of currently available nonplanar imprint technologies, with higher throughput and fewer concerns about master durability. In addition, due to the biocompatibility of silk, nonplanar PiP can be used to apply nanophotonic structures to curved biological surfaces (D.-H. Kim et al., *Science* 2011, 333, 838-43; J. Viventi et al., *Nature Neuroscience* 2011, 14, 1599-605). Together, this approach provides a versatile and simple fabrication method for biointegrated silk devices, further expanding the utility of silk fibroin as a bridge between high technology and biomedical applications.

Method and Mechanism

Figure 1:
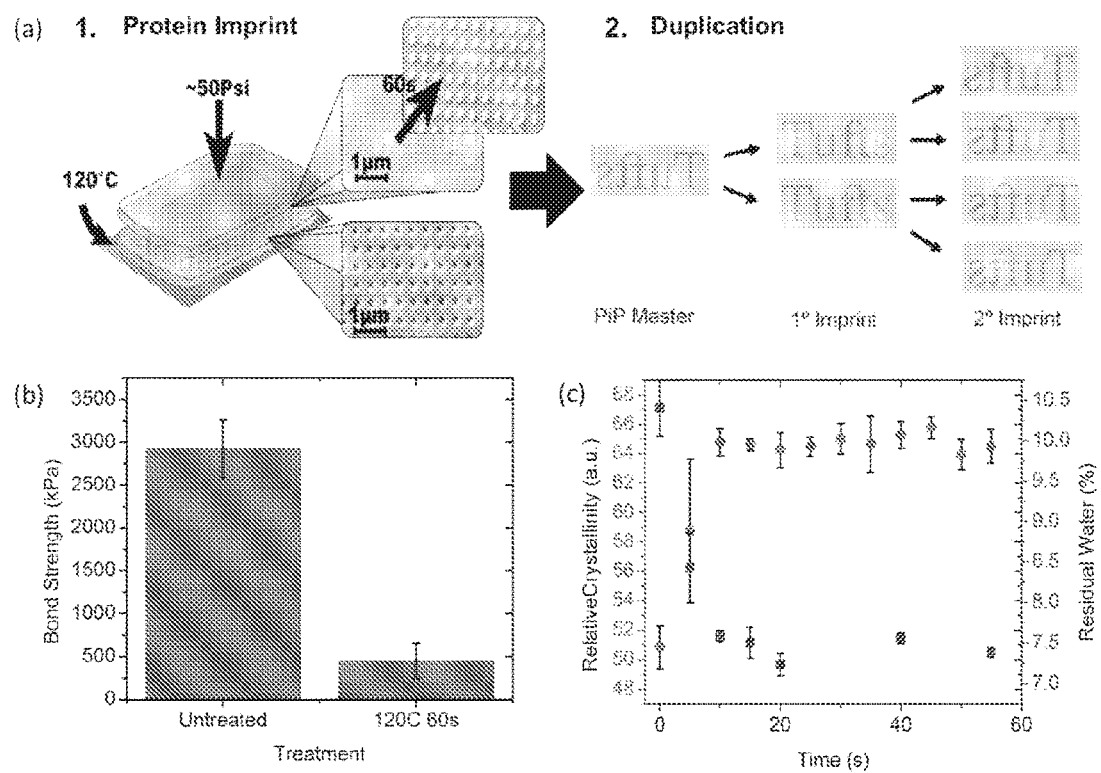
FIG. 1 provides schematics of the PiP process, and replication mechanism. (a) Each imprint was made by layering an untreated (blue) film on top of a crystallized silk fibroin master (yellow). These samples were placed on a heated substrate at 120° C. for 60 seconds, with ~50 Psi pressure. Reflow of the untreated films (SEM micrographs, inset) complete the pattern transfer. Duplication can be carried out by using each generation to imprint the next, making the technique truly high-throughput. (b) Lap shear bond strength for overlapped, PiP-pressed films of untreated and 120° C. 60 seconds pre-treatment. A 6 fold drop of in bond strength was seen with the crystallized films. (c) Crystallinity kinetics and residual water content for films throughout the PiP process. A crystallized plateau was reached after 15 seconds of pressing. Water loss follows the inverse pattern of crystallization.

The PiP process is shown in FIG. 1a. A patterned silk master, shown in yellow, was placed underneath the film to be protein imprinted, shown in blue, on a smooth polished Ni surface (for uniform thermal distribution) heated to 120° C. About 50 Psi of pressure was applied to the top and held for between 5 and 60 seconds, during which reflow occurred. This produced the inverse pattern in the blank film, as shown in the scanning electron microscope (SEM) images. If crystallization occurs in the imprinted film, this new film could be utilized as a master for a subsequent generation, which would then have the original pattern, as shown in step two. Such a methodology could lead to multiplexing the production of films (for instance two imprints per generation would yield 4 positive and 8 negative imprints of the master in only three generations).

Indeed, crystallization of the imprinted films does take place, as is shown in FIG. 1c. Here, Fourier-transform infrared (FTIR) spectra were taken for heated films at 5-second intervals, and beta-sheet content of the films was quantified using previously established curve-fitting procedures (V. a Lorenz-Fonfria & E. Padros, Spectrochimica Acta. Part A, *Molecular and Biomolecular Spectroscopy* 2004, 60, 2703-10; X. Hu et al., *Macromolecules* 2006, 39, 6161-6170; Q.-N. Wei et al., *Journal of Applied Polymer Science* 2012, 125, E477-E484). At 120° C. and ~50 Psi, the kinetics of crystallization occurred rapidly, with the films reaching a crystalline plateau after only 15 seconds of pressure. This plateau was found to be equivalent, if not higher, in crystalline content to conventional silk film annealing treatments such as exposure to methanol. Additionally, the hydration state of the films was monitored using Thermal Gravimetric Analysis (TGA), in a similar procedure. Films dried under ambient conditions were found to have ~10.4% residual water, which rapidly decreased to ~7% as the crystallinity increased, as shown in FIG. 1c. This corresponds to little change in the $T_g$ of the plasticized film, with a glass transition close to 80° C. in all cases.

The adhesion of the two layers after imprinting is essential to the success of the process, as difficulty in separating the two films could cause damage to either nanoscale pattern, decreasing yield. Investigation of the inter-layer adhesion was examined, by performing tensile testing (Instron 3360, Instron Inc., Norwood, Mass.) both for untreated films, and films crystallized via the PiP method. The figure shows a 6-fold decrease in interfacial strength, to a value of less than 500 kPa, indicating easy separation of the two layers after PiP, because of the crystallization of the films. This property is advantageous, as both high and low adhesion strengths are possible in the same material through the control of the thermal transition, thus enabling imprinting.

Additionally, the data indicate that the crystallization plateau is responsible for locking the imprinted pattern into place, as the $T_g$ does not change appreciably with the modest (~3%) reduction in water content seen here (N. Agarwal et al., *Journal of Applied Polymer Science* 1998, 63, 401-410). The kinetics of crystallization, and thus reflow, occurs rapidly, which means PiP imprints may be possible on an even shorter timescale. This confirms that it should be possible to directly imprint subsequent generations utilizing imprinted owing to the high degree of crystallinity imparted by the process.

Characterization

Figure 2:
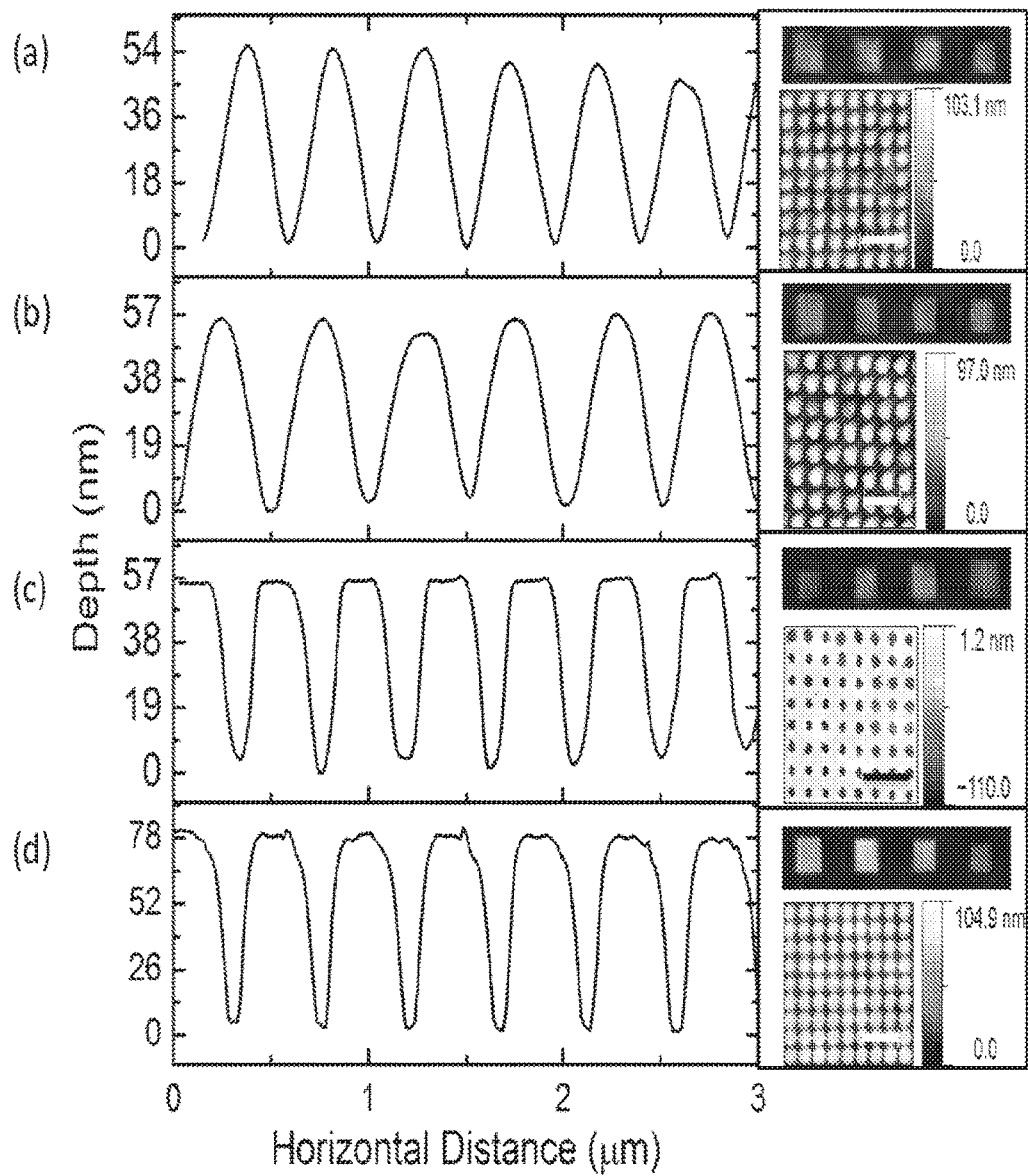
FIG. 2 provides characterization of multi-generation PiP imprint, showing mean AFM cross section, AFM topology, and darkfield optical response of 200 nm diameter nanopillar lattice. Scale bars 1 µm. (a) Third generation imprint. (b) First generation PiP imprint. (c) Silk master generated through nanoimprint lithography. (d) Silicon master fabricated through electron beam lithography.

The PiP mechanism suggests the possibility of multi-generation imprinting, which was confirmed by evaluating the pattern quality (e.g., resolution) with subsequent imprinted generations. For this, electron beam lithography written periodic photonic crystal structures of 100 nm tall, 200 nm diameter Cr pillars on Si—which serves as the original (non-silk) master and a baseline for imprinting quality comparison—was utilized, with lattice constants varying from 200-700 nm. The optical response under darkfield illumination (Olympus IX71, Center Valley, Pa.) as well as the surface profile measured via atomic force microscopy (AFM)(Veeco Dimension 3100, Plainview, N.Y.) have been collected, as shown on the right hand side of FIG. 2d. The mean cross section of the image is shown on the left. This master was utilized to create an inverse silk master through the previous rapid nanoimprinting technique (FIG. 2c). The results show good spatial and optical fidelity, with a slight reduction in pattern depth (57 nm vs. 80 nm), accompanied by sharper features at the extremes.

The silk master was then utilized in PiP to create a first generation imprint (FIG. 2b), which in turn imprinted the second generation, which then produced the third (FIG. 2a). The results of these imprints show a modest reduction in reproduction of the nanoscale features with each subsequent generation, marked by rounding of the sharp edges of the features. No further decrease in feature depth was seen, and more importantly, no appreciable change in optical response was noted. Based on this the possibility of at least three generations of imprints via the PiP method seems to be a reasonable assertion. Given this, the number of possible samples becomes $N^2+1$ negative and $N^2+N^3$ positive imprints, where N is the number of imprints per generation. As further generations beyond this are produced, the quality will degrade, eventually affecting the macroscale properties and efficacy of the imprinted patterns.

Figure 3:
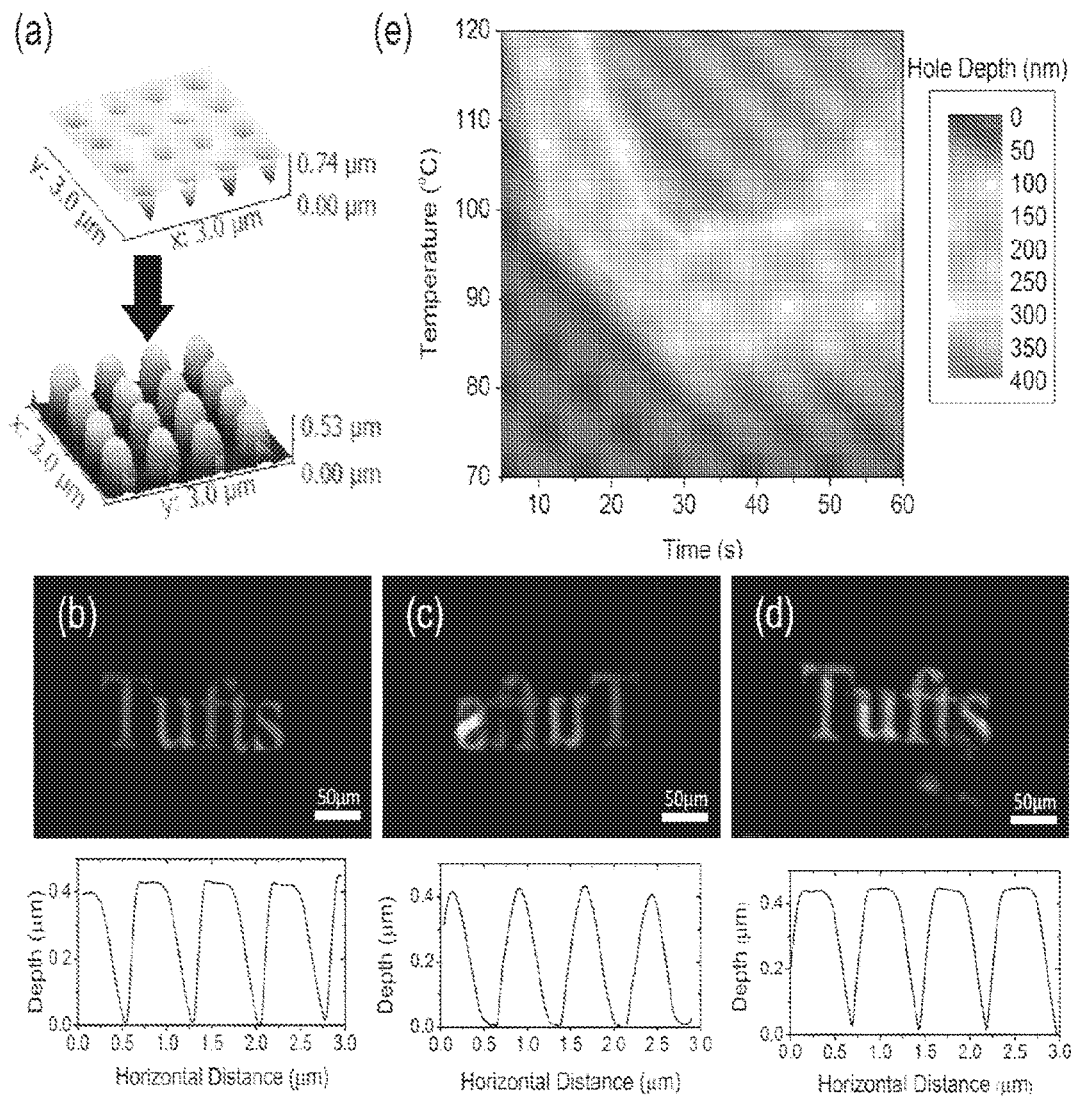
FIG. 3 provides characterization of PiP parameter space. (a) AFM topography of PiP imprint process for parameter space characterization. (b) Darkfield optical response and AFM cross-section of silk master. (c) Characteristic optical response and AFM section of PiP imprints. Imprinted at 110° C. for 30 seconds. (d) Darkfield optical response and AFM cross-section of silk master after 18 uses. (e) Interpolated contour plot of imprint quality as measured by hole depth over PiP parameter space. Differences in kinetics with temperature are clearly seen. No response seen below 80° C.

The exploration of the PiP mechanism above also indicates the possibility of optimization of the PiP procedure for specific applications by altering the temperature and time used for imprinting. This was assessed via a similar experiment within a broad range of these two primary imprinting parameters. Here, a silk master of a similar lattice, with optical response shown in FIG. 3b-d, was utilized to imprint a single generation, which was then investigated via AFM. This master however, was produced to have an initial hole depth of ~500 nm, with a similar diameter of 200 nm and lattice constants varying from 200-700 nm. The results of the imprinting process are shown in FIG. 3a. Once again, a reduction in hole depth was seen with the first imprint, and rounding of the features was noted. Imprints were made at temperatures between 70 and 120° C. for times between 5 and 60 seconds.

An interpolated contour plot of the results is shown in FIG. 3e. The results show a maximum depth of above 400 nm, reached at ~20 seconds for 120° C. and ~30 seconds near 100° C. the depth then rapidly decreased, with no imprints made below 80° C. This response makes sense given the PiP mechanism, where no reflow occurs below $T_g$. The kinetics of crystallization, determined by the temperature used, would be slower at lower temperatures leading to the slower reflow response noted here (X. Hu et al., *Biomacromolecules* 2011, 12, 1686-96). This broad parameter space for imprinting allows the PiP parameters to be tailored to the application.

The same master was used though the course of this experiment, and was analyzed before and after use. The results are shown in FIG. 3b-d, with 3b and 3d representing the same master before and after being used for 18 imprints, and 3c showing a characteristic image of one of those imprints. As before, the imprint showed rounding of the features, with little measured variation in depth. The master, however, shows little to no change after 18 uses, specifically on the nanoscale, as the cross sections show. This indicates that 18 imprints is a reasonable expectation for each generation, which would yield a maximum of $N^2+1=325$ negative and $N^2+N^3=6,156$ positive imprints from a single use of the original master. With each of these imprints occurring in as little as 20 seconds, and accounting for the possibility of multiplexing (FIG. 1a(2)), PiP is a viable option for high-throughput nanofabrication on silk fibroin films.

Conformal Imprinting and Extensions

Figure 4:
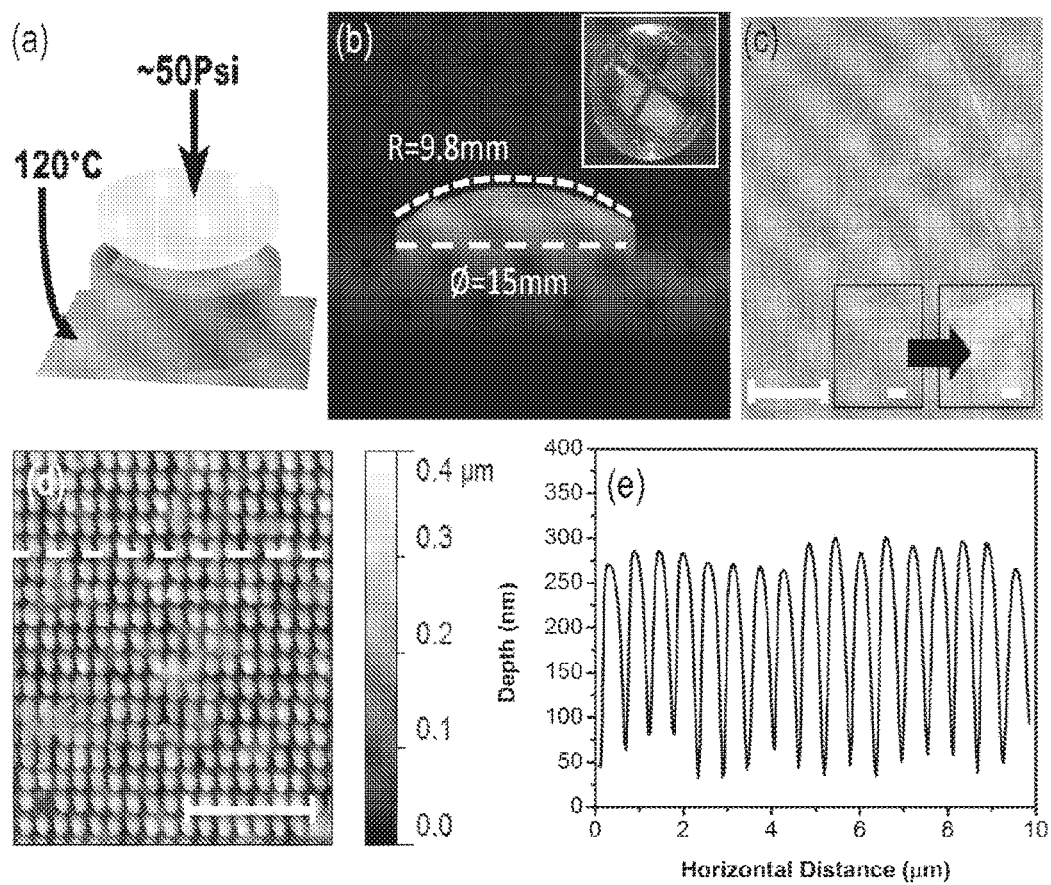
FIG. 4 illustrates conformal PiP and surface transfer. (a) Modification to the PiP process for conformal imprint, showing the addition of aluminum tool for normal pressure application. (b) Lens characteristics, 9.8 mm radius of curvature, 15 mm diameter. Inset: Imprinted lens. (c) Transfer of film imprinted on lens to curved biological surface (scale bar 4 mm). Inset: change in colorimetric response of the imprinted film with the addition of ethanol to the surface (scale bars 1 mm). (d) AFM topology. Scale bar 5 μm. (e) AFM cross section of conformal imprint, showing good pattern replication across all dimensions.

In addition to increasing throughput, the relative flexibility of the silk fibroin masters as compared to a hard silicon or metal mask was leveraged to directly achieve conformal imprinting. The modified scheme for this method is shown in FIG. 4a. PiP was used to imprint directly on a plano-convex lens with diameter of 15 mm and radius of curvature of 9.8 mm, whose surface was coated with a thin layer of silk (FIG. 4b). After PiP at 120° C. for 60 sec, the surface was evaluated with AFM (FIG. 4d,e). The results showed good reproduction of the master pattern on the microscale of features on the order of 100 nm, which is comparable to currently available options (W. M. Choi & O. O. Park, Nanotechnology 2004, 15, 1767-1770; R. Mukherjee et al., Industrial Engineering Chemical Research 2009, 8812-8818; B. Farshchian et al., Microelectronic Engineering 2011, 88, 3287-3292), while the optical response (FIG. 4b, inset) shows coverage over the entire curved lens surface. The combination of this technique with previously reported silk transfer techniques for arbitrary surface transfer (H. Tao et al., *Advanced Materials* 2012, 24, 1067-72; D.-H. Kim et al., *Science* 2011, 333, 838-43; D. Kim et al., *Nature Materials* 2010, 9, 511-517) can yield conformal contact on curved tissue surfaces, as is demonstrated in FIG. 4c. Here, the film was removed from the lens and transferred and adhered to the skin. By this method, PiP can be used to manufacture molded curvilinear silk protein based sensing devices that could integrate with the human body. The possibility of a skin-skin mounted sensor fabricated using PiP was explored as a proof of concept demonstration by monitoring the shift in the colorimetric response of the device with the addition of a thin coat of ethanol (FIG. 4c, inset).

Conclusions

PiP is introduced as a rapid, high-throughput method for the fabrication of nanoscale structures in silk films. The possibility of at least 3 generations of imprints with at least 18 imprints per generation was demonstrated, making this a truly high throughput technique. Application to conformal surfaces is possible with minor adjustments to the system, at resolutions comparable to other currently available non-planar nanoimprint lithography techniques. The addition of PiP to the silk materials fabrication toolbox opens new avenues for biocompatible device fabrication, which will further expand the utility of silk as a bridge between high technology and biomedical applications.

EXPERIMENTAL

Silk Processing:

Aqueous silk solution was produced by regeneration from *Bombyx mori* cocoons according to established procedures (S. Sofia et al., *Journal of Biomedical Materials Research* 2001, 54, 139-48). Briefly, the cocoons were boiled for 30 min in a 0.2 M solution of sodium carbonate to remove sericin, glue like protein holding the cocoon together. The fibers were dried overnight, and then dissolved in a 9 M solution of lithium bromide. Dialysis against Milli-Q for ~72 hours yielded a roughly 6% aqueous solution of silk fibroin. All casting work was carried out on a PDMS surface or directly on a patterned silicon master. The films were dried at ambient conditions (~25° C., ~40% RH) and resulted in films that were ~100 μm thick.

Silk masters were produced using these films, and applying the existing silk nanoimprint lithography technique (H. Perry et al., *Advanced Materials* 2008, 20, 3070-3072; J J. Amsden et al., *Advanced Materials* 2010, 22, 1746-9), by heating to ~120° C. for 60 sec against a metal master. Heat or methanol treatments have been previously reported to be able to tune the β-sheet crystallinity of silk fibroin and were used to crystallize the master in this work.

FTIR Spectroscopy:

FTIR scans were taken on a (Jasco FTIR 6200, Easton, Md.) spectrometer with attached ATR detector. A total of 64 scans at a resolution of 4.0 $cm^{-1}$ were co-added to produce spectra ranging from 400-4000 $cm^{-1}$. A cosine apodization was simultaneously applied by the software. From these scans, the amide III region (1200-1350 $cm^{-1}$) was selected for its sensitivity to protein secondary structure and lack of sensitive to water content. Amide III curves were normalized and baseline corrected, and then fit to 12 Gaussian curves, according to the work of Wei et al. (*Journal of Applied Polymer Science* 2012, 125, E477-E484). Bands corresponding to β-sheet secondary structure motifs were then added to give a relative value for the β-sheet crystalline content of the films.

Thermal Gravimetric Analysis (TGA):

Water content of the silk films was assessed through TGA (TA Instruments Q500, New Castle, Del.). Films were heated to 200° C. at a rate of 10° C. $min^{-1}$ with a constant mass measurement. All of the mass lost during this procedure was determined to be water evaporation, according to published results. All water is removed by 187° C., and total water removal is independent of heating rate for silk fibroin films (X. Hu et al., Thermochimica Acta 2007, 461, 137-144).

Tensile Testing:

Tensile testing (Instron 3360, Instron Inc.) of the interface between the two films was performed for mode 2 failure via a conventional lap shear configuration. This process was similar to ASTM D3163, with modified geometry due to specimen limitations.

Conformal-PiP Die Fabrication:

An aluminum piece was machined on a lathe to the inverse specifications of the surface to be imprinted, in order to ensure pressure was normal to the surface in all locations. Aluminum was selected as the material for this piece due to its high thermal conductivity (~230 W $m^{-1}$ $K^{-1}$), to ensure that the heat transfer properties of the system were minimally affected.

Silk Film Transfer:

Silk films were transferred onto skin via a previously established transfer procedure (H. Tao et al., *Advanced Materials* 2012, 24, 1067-72). Briefly, the side of the film to be attached was exposed to a high (~90%) relative humidity environment for a few seconds to partially solubilize the film. The film was then applied to the transfer surface with light pressure and allowed to dry, thereby attaching it to the surface of the skin.

Example 2: Development of Silk Embosser

An exemplary embossing system was developed for silk film imprinting and stamping. This system features temperature controlled embossing surfaces, adjustable embossing pressures, and variable embossing times. The device can also be fitted with interchangeable temperature controlled embossing and stamping tools. The design, development, fabrication, applications, and device future are explored for both systems. These devices may facilitate new discoveries and in the case of the embosser, may provide a path towards high volume production of silk film based technologies.

Silk films have been shown to be useful as optical instruments. These films can be used to replicate fine features at the nanoscale level. Simple hot embossing techniques were developed to imprint nanoscale patterns into silk films. These techniques involved using a simple hot plate and applying pressure by hand. These processes, although successful, could be made simpler by developing some simple devices.

A simple embossing device was first created using a simple office desktop embosser. This device proved useful for a series of experiments, but had some shortcomings. Since the device was controlled manually, with the exception of the temperature control, there was little control over embossing pressures and times. So an improved design was created based on the lessons learned from the first design iteration. The second design included provisions for programmable embossing time and programmable pressures. These parameters can be keyed in using a simple computer interface. This design required the use of mechanical CAD software, a series of industrial controls, and extensive programming.

Silk Film Embossing System

Embossing is the process of creating an impression of a design or pattern on another surface. Hot embossing is the process of heating a material to reach its glass transition temperature (Tg) and applying sufficient pressure to imprint a pattern. This process allows for the rapid replication of features. A nano-embosser is an embossing device capable of imprinting patterns at a small scale. These machines can replicate many fine features but require high temperatures and pressures. Using silk films, it is possible to imprint patterns with features on the nanoscale using low pressures and low temperatures. Rather than spending many thousands of dollars on such a device, a simplified version of the tool was developed.

Nano embossing has become a useful process that offers relatively low cost patterning of nano-scale features over large areas. This technology has applications in the field of MEMs, optoelectronics, biomedical, and micropackaging (Worgull M. Hot embossing [electronic resource]: Theory and technology of microreplication. 2009: 1 online resource (xix, 345).

Creating a low cost reproduction method for silk film devices could facilitate silk's wide acceptance for use in biomedical and photonic applications. This represents the first step towards a high volume production system for silk film patterned devices. The concept of silk film embossing has been described previously (Amsden J J, Domachuk P, Gopinath A, White R D, Negro L D, Kaplan D L, Omenetto F G. Rapid nanoimprinting of silk fibroin films for biophotonic applications. Adv Mater. 2010; 22(15): 1746-1749). It was reported that silk films can be used to replicate nanoscale features. Tests were performed with a hot plate that heated a patterned nickel shim. A transparent silk film was placed on top of the heated shim and some pressure was exerted. This caused the silk film to form to the master at a very small scale. It was desirable to create a system with repeatable temperature and pressure profiles. In this section two embossing system designs are presented. As described in further detail below, the first is a modified desktop embosser, while the second is a custom device designed and fabricated in-house.

A portable embossing system was developed using a standard desktop embosser and some off the shelf industrial automation components. In the system the smooth bottom plate was used as a controlled heated surface. An Ultra Thin Sheet Heater (McMaster-Carr Part Number 35475K12) with an adhesive backing was trimmed to size and placed on the top side of the plate. The heater contains a meandering conductive strip sandwiched between thin insulating sheets. The wire leads required to run the heater were terminated with a bayonet style connector. On the underside of the plate a thermocouple is mounted to monitor the temperature. The thermocouple leads are terminated with a thermocouple plug. Both the heater and thermocouple connect to a small control box which houses the necessary control electronics to make any necessary temperature adjustments. Within the enclosure lies an OMRON temperature controller and a Solid State Relay to control the output (ESCSV temperature controllers [homepage on the Internet]. Sep. 24, 2012 [cited Nov. 30, 2012]. Available from: http://www(dot)ia(dot)omron(dot)com/products/family/1624/). The controller is capable of running a PID control loop and includes an auto tuning features which eliminates any need to manually alter the controller's settings. The solid state relay allows the plate to be heated at intervals of minutes to milliseconds. The ability to turn the heater output on and off at precise intervals is what allows the heated plate to sustain its temperature over a long period of time. FIG. 13 shows this system built and running with a controlled temperature of 80 Degrees Celsius.

The device has been used for several nanoimprinting experiments. To do so a nickel shim master is placed on top of the heated plate. The temperature is set using the buttons on the front panel of the temperature control device. Once the temperature has been keyed in, the metal plate is heated until the set point is reached. The silk film can then be placed on top of the master. Pressure is applied by pushing down on the lever. Typically, the pressure is applied for a period of five seconds to a minute and temperatures range from 50 to 120 degrees Celsius. An example of what can be achieved using the portable embosser is shown in FIG. 15.

Design

The portable desktop embosser was quite useful, but an effort was undertaken to develop an embossing system that was more flexible, had two heated surfaces instead of one, and had an adjustable range of pressures. The following section details the design and development of a semi-automated desktop embossing system.

A drawing of the improved embossing systems is shown in FIG. 16. The system employs the use of a pneumatic cylinder as the means to provide the embossing pressure. The cylinder coupled with a proportional valve system allows for controlled embossing pressures. Three 8 inch by 8 inch aluminum plates each with a thickness of ½ in along with four 16 inch long metal extrusions make up the body of the embosser. These components provide a stable platform that holds the cylinder in place and provides a cross-member for the embossing. The bottom plate is shown in design is detailed in FIG. 17.

The center plate sits on top of the cylinder to provide additional stability to the device. One inch notches have been cut out of each corner to accommodate metal extrusions that run up along each corner of the structure. This design is shown in FIG. 30.

The top plate is similar to the bottom plate in that it has holes to accommodate the screws that fasten the extrusion pieces to the rest of the structure. Instead of a large hole for the cylinder, four holes with a counterbore are supplied at the center of the plate. These holes allow for the mounting of the interchangeable heating plates. The plate is attached by fastening it with four M10 screws. The design of this plate is shown in FIG. 31.

Two metal plates are used as the embossing surfaces. Each plate has been machined so that two 4 inch long ¼ in diameter cartridge heaters can be inserted. Each cartridge can provide 100 W of heat to the metal plate. These cartridges are connected to a solid state relay that is controlled by a programmable logic controller. Using this controller along with an attached thermocouple, the plate temperatures can be regulated. There are two independently controlled plates in the design. This can be seen in the front view of the device in FIG. 32. These plates can be changed in the future if it is determined that different plate geometries are needed. Four screws hold each plate in place. All that must be done is to remove the four screws and replace the plate with one that matches the threaded hole pattern.

The system is controlled with an Allen-Bradley Micro830 Programmable Logic Controller. Additional information about the Micro830 control system may be obtained from: http://ab(dot)rockwellautomation(dot)com/Programmable-Controllers/Micro83-0. The controller has the capability to handle a number of digital inputs and outputs, serial connectivity, and can handle simultaneous PID loops. The Micro830 also has three available slots for plug-in modules. The capabilities are extended with the use of three Plug-in modules. The first module is the TC-2 module that allows for the use of up to two thermocouples. The second module (OF-2) provides two channels of analog voltage or current output. Each output can be configured as a voltage or current source. As a voltage source, the module can supply between 0 and 10 VDC. As a current source, the module can supply a 4 to 20 mA output. Lastly, the IF4 module is used to allow for analog voltages or currents to be measured. This is intended to allow for the inclusion of sensors in a further revision of the system. The system requires an additional power supply provided by Allen-Bradley. A 24 VDC power supply is required to provide the necessary power to the control electronics.

The controller is programmed using the manufacturer's Connected Components Workbench software. The software development environment allows the developer to create a standalone product utilizing ladder logic, structured text, or functional block diagrams. The program for the embosser uses a combination of structured text, functional block diagrams, and ladder logic modules (Bishop R H, editor. Mechatronic system control, logic, and data acquisition [electronic resource]. Boca Raton: Taylor & Francis; 2008; Bolton W. Programmable logic controllers (5th edition);

Parr E A. Programmable controllers. 3rd ed. Oxford; Burlington, Mass.: Newnes; 2003).

To control the two heated plates, an output of the controller is connected to a solid state relay. The solid state relay output is connected to a 120 VAC supply and two 100 W cartridge heaters. Each heater has its own receptacle drilled into the back of the metal embossing surface. A solid state relay allows the controller to pulse the output at almost any interval to accurately control the heat applied to each plate. A connected thermocouple provides the feedback necessary for the temperature control loop. Each heated plate in the design has its own thermocouple, solid state relay, and associated cartridge heaters. A drawing of the heated plate is shown below in FIG. 34. A thermocouple bayonet adapter is threaded into the center hole. The hole extends half way into the plate to read the current temperature at the plate's center. Two 4 inch deep holes have been drilled on each side of the thermocouple to provide a place for the cartridge heaters. The cartridge heaters are each 4 inches long and have a nominal diameter of ¼ in. At the end of each heater are two leads which must be connected to an appropriate power source. In this design both heaters are connected in parallel so that both heaters will energize when the PLC commands the solid state relay to provide power. A view of the back side of the design is shown in FIG. 35. A pneumatic cylinder has been chosen as the method for applying pressure between the two plates. One plate is stationary and is fastened to the top crossbar of the embosser. The other plate is fastened to the end of the piston of the pneumatic cylinder. Control of the cylinder is achieved by the use of a proportional valve (Festo VPPM-6L-L-1-G18-0L6H-V1N). A suitable air supply is connected to the inlet port of the proportional valve. The outlet port is connected to one of the ports of the pneumatic cylinder. The pneumatic cylinder is equipped with two ports. Supplying air into one of the ports will push the piston outward while supplying air into the other port would cause the piston to retract. In this design, the piston will be forced out and the pressure will be maintained by the proportional valve component. The analog output module of the Micro830 PLC provides the necessary voltage signal to control the proportional valve. Any necessary scaling of the output pressure is performed by the valve system electronics.

Electrical and Software

This project involved both hardware and software design. The software design was done in two parts. Programming had to be done within the PLC control system and an additional software interface had to be programmed so that a user could set all the necessary embossing parameters.

In order to program the Allen-Bradley PLC system, a free software development package was used. Connected Components Workbench (CCW) from Rockwell automation serves as the software development suite for the entire family of Allen-Bradley Micro800 series of controllers.

A series of tasks must be performed by the PLC. Among them are the management of two temperature control loops, commanding a scaled voltage to drive the proportional valve and cylinder, and the handling of both incoming and outgoing serial communications.

The management of the temperature controls is done in software by monitoring the current temperature using a thermocouple and adjusting the amount of heat. As the plate heats up and approaches the target temperature, the PLC starts pulsing the heater output. The duty cycle of this pulsing goes from 90% down to zero. A simple on/off control for heating would cause very large overshoot of the target temperature. In a future iteration there could be an addition of a PID control loop. The PID control loop proved difficult to tune and it was decided to implement a simpler control scheme. The rung of the ladder diagram for temperature control is shown in FIG. 13.

The PLC stores a value for each thermocouple reading. The value location depends on the module's physical position on the PLC. In this design the module has been placed in the first physical location. Within the programming environment, the programmer must identify the existence and location of each module. A screenshot of this process is shown in FIG. 15. By selecting the TC-2 module in the first slot, the user has the option to change the type of thermocouple used. A configuration panel appears below the picture of the device. The design uses J Type thermocouples and a scan frequency of 16.7 Hz for each channel With the two channels configured, it's now possible to read the temperature of each thermocouple.

Thermocouple measurements are performed periodically by the PLC. The programmer only needs to retrieve the value from the appropriate location and do some necessary math to obtain a useable value. The thermocouple reading is stored in a two byte register as an unsigned number. This number will range from 0 to 65535 and is found by accessing the variable _IO_P1_AI_00 for channel 0 and _IO_P1_AI_01 for channel 1. To convert the value to degrees Celsius, 2700 must be subtracted and that result must be divided by 10. An example follows:

$$\_IO\_P1\_AI\_00 = 2991$$

$$\text{Degrees C.} (\_IO\_P1\_AI\_00 - 2700)/10$$

$$(2991-2700)/10 = 29.1 \text{ Degrees C.}$$

Channel 1 is read in the same manner.

In order to command the proportional valve, a voltage of 0 to 10V must be supplied. This is done using the 2080-OF2 module. First, the module must be configured within the CCW development environment. The design uses one analog output channel By selecting the 2080-OF2 module in the second location, a menu will appear at below the picture of the controller. Each channel can be configured as a voltage or current output. In this design, channel 0 will be configured as a voltage output and channel 1 will be disabled. This configuration is shown in FIG. 17.

To command a voltage at the terminals of the analog output module, an unsigned 16 bit number must be written to the proper location. With an analog module in the second module location, channel 0 will be addressed using the system variable _IO_P2_AO_00. A number ranging from 0 to 65535 is written to the system variable. In this case writing a 0 to the variable will provide a 0V output and writing 65535 will provide a 10V output.

The following example demonstrates how to command a voltage of 3.0V using the analog voltage output of the PLC.

$$3V/10V * 65535 = 19661$$

Writing the value of 19661 to the system variable _IO_P2_AO_00 will produce a 3.0V output.

The analog output module commands the proportional valve. The user interface on the PC must first send a control message to the PLC to communicate the scale of the output and the duration. The whole embossing sequence has been programmed as a single rung in a ladder diagram. The sequence is shown in FIG. 18.

When an Emboss flag is set within the PLC software, it initiates the Embossing process. First a preprogrammed 4% output control voltage is sent to the proportional valve for a period of 1 second. This allows the pneumatic cylinder to rise slowly before rising to higher pressures. By using the SCALER function block, a 4.0% output can be scaled to an integer to command the valve. The value is converted from a real type to an integer using an ANY_TO_UINT function block. The output of this block writes a value to the register commanding the voltage output. Then the TON function block is used to delay for 1 second before the pneumatic cylinder is commanded to a higher pressure. The sequence is the same, the pressure is scaled for the output module and a delay timer is engaged for the specified number of seconds. After the programmed time has elapsed, the pneumatic valve is commanded to a 0% (0V) output. This causes the piston to drop under its own weight. The Emboss flag is then reset so that the process can be performed again.

There is an additional module installed in the third location. An analog input module is not currently used, but could provide the necessary interface for any analog sensors.

Onboard digital outputs are used to control the solid state relays in the design. There is no need for additional modules for standard I/O. The unit provides 14 input channels and 10 output channels.

An on-board serial port is used to communicate with a host computer. The Micro830 has its own dedicated serial port, but a proprietary connector must be used to connect to a standard 9 pin serial computer connection. Depending on the type of host computer that is used, a USB to serial converter might be required. Serial ports have been configured to run at 19200 bps. In order to configure the serial port on the PLC, it must be selected in CCW and configured. FIG. 19 illustrates the configuration of the onboard serial port for the embossing system.

Serial messages are sent from the host computer to the PLC to configure the necessary temperature set point for the top and bottom plates, proportional valve control, and embossing timing. The PLC sends periodic messages to report each plate's current temperature throughout the process. This information is captured and parsed by the PC and displayed to the user.

A communication protocol was developed to communicate between the host program and the software running on the PLC. Communication was achieved by using the serial port object within Visual Studio (Del Sole A. Visual basic 2010 unleashed. Indianapolis, Ind.: Sams; 2010; Bai Y. The windows serial port programming handbook. Boca Raton, Fla.: Auerbach Publications; 2005). Messages initiated from the PC application have the following form:

$UTEMP40LTEMP40PRESS65TIME30EMBOSSNO HALTNO#??

Carriage return and linefeed characters are appended to each message. Messages are trapped between two delimiters $ and #. A short word identifies each field of the message. The above message would command both the upper and lower plate temperatures to be set at 40 degrees Celsius. The proportional valve would be set at 65% of its maximum. Embossing time will be set at 30 seconds. The value following the EMBOSS field reads NO, which indicates embossing will not start. Also, the NO following the HALT field indicates that the embossing does not need to be interrupted.

The same above command can be used to initiate the embossing process with one change.

$UTEMP40LTEMP40PRESS65TIME30EMBOSS YESHALTNO#??

Although it may seem wasteful to send the entire message each time, the overhead is quite low and allows for a simpler parsing routine on the PLC. Attached to each message is a checksum. This is denoted by the two question marks following the control message. This checksum is generated by the PC side software and checked on the PLC side. Using a checksum to validate the message ensures that commands are not compromised. The checksum is an exclusive or of each character in the command starting with the '$' character and ending with the '#' character. If an improperly formatted message is detected on the PLC, no action will be taken. Future enhancements to the system could include additional commands for other controls tasks.

A table of valid commands is listed in Table 1.

TABLE 1

| Valid Control Messages | |
| --- | --- |
| Field | Valid Values |
| UTEMP | 0 to 200 |
| LTEMP | 0 to 200 |
| PRESS | 0 to 100 |
| TIME | 1 to 60 |
| EMBOSS | YES or NO |
| HALT | YES or NO |

A function block diagram was created to validate the checksum and parse the message coming from the PC. The function block is shown in FIG. 20.

The function block has only one input. The InString variable captures a properly terminated control string from the serial port buffer. It then validates the message's checksum and parses the control message. Parameters from the message are then transferred to the proper variables. The code for this function block is Appendix A The code begins by locating the '#' character which denotes the end of the message. It then calculates a checksum by using an exclusive or for all the characters including the '#' character. A comparison is made to see if the message checksum matches the calculated checksum. If the checksum is correct, the message is parsed and the output variables are populated. If there is a problem with the checksum, no action will be taken. This ensures that malformed messages do not adversely affect the machine.

A status message is sent periodically from the PLC communicating the current temperature of the plates. An example message is shown below.

$UT43LT37#??

This indicates that the upper heated plate currently reads a temperature of 43 degrees Celsius and the lower plate reads a temperature of 37 degrees Celsius. Again, this message is trapped between the two delimiters $ and #. This message is read by the computer and parsed to inform the user of current temperatures.

TABLE 2

| Valid Control Messages | |
| --- | --- |
| Field | Valid Values |
| UT | 0 to 200 |
| LT | 0 to 200 |

The function block for this is shown in FIG. 21. Both TC_IN1 and TC_IN2 are inputs to thermocouples. These inputs are read and scaled within the function block code. The outputs are NumChars and Output_String. NumChars is the number of characters present in the Output_String and Output_String is the series of characters generated by the function block code.

The Report_Temp code is listed in Appendix B. Both thermocouple inputs are read and scaled. A string of characters is created using the format explained previously. Once the string is complete an exclusive or checksum is generated and appended to the string of characters. Finally, the number of characters in the string is calculated and the final string is generated.

A computer interface was created using Microsoft Visual Studio. Once the user is connected to the PLC via a serial communications link, the current temperature is reported by the interface. Then the user may make temperature adjustments, pressure adjustments, and change the embossing time. The user interface is show in FIG. 22.

Fabrication

The system was simple to build given its overall simplicity and low part count. The assembly process took approximately 30 minutes. A photo of the completed embosser is shown in FIG. 23. The completed embosser and the controls are shown in FIG. 24.

Applications

The desktop embosser was used in experiments regarding protein-protein imprinting and the creation of silk pockets. The embosser has been used in early experiments regarding the fabrication of silk based batteries. An embossing temperature of 100 degrees Celsius, an embossing time of 90 seconds, and maximum pressure was used. For an initial experiment the following arrangement was employed: Aluminum-silver battery as an initial model system: silk, aluminum foil (anode), potassium nitrate in silk (salt bridge), silver nitrate in silk (cathode), aluminum foil (charge collector), and silk. The result is a silk sandwich with two exposed leads. Voltage was measured at the terminals as shown in FIG. 37.

APPENDIX A

```
checksum := 0;
NumChars :=FIND(InString, '#');
FORindex :=0TONumCharsBY1DO
    checksum := XOR_MASK(checksum,
ANY_TO_DINT(ASCII(InString,Index)));
END_FOR;
IF checksum = ANY_TO_DINT(MID(InString,FIND(InString, '$R')-
FIND(InString,'#')+1),(NumChars+1))) THEN
checksumOK :=TRUE;
UpperTempSet := ANY_TO_DINT(MID(InString,FIND(InString,
'LTEMP')-(FIND(InString,
'$$UTEMP')+5),FIND(InString, '$$UTEMP')+ 6));
LowerTempSet := ANY_TO_DINT(MID(InString,FIND(InString,
'PRESS')-(FIND(InString,
'LTEMP')+4),FIND(InString, 'LTEMP')+ 5));
PressSet := ANY_TO_REAL(MID(InString,FIND(InString, 'TIME')-
(FIND(InString,'PRESS')+4),FIND(InString, 'PRESS')+ 5));
TimeSet := ANY_TO_TIME(ANY_TO_UINT((MID(InString,FIND
(InString, 'EMBOSS')-
(FIND(InString, 'TIME')+3),FIND(InString, 'TIME')+4))) * 1000);
IFFIND(MID(InString,FIND(InString, 'HALT')-(FIND(InString,
'EMBOSS')+5),FIND(InString, 'EMBOSS')+ 6), 'YES') >0THEN
    Emboss :=TRUE;
ELSE
    Emboss :=False;
END_IF;
IFFIND(MID(InString,FIND(InString, '#')-(FIND(InString,
'HALT')+3),FIND(InString,
'HALT')+ 4), 'YES') >0THEN
    Halt :=TRUE;
ELSE
    Halt :=False;
END_IF;
ELSE
    checksumOK := FALSE;
END_IF;
```

APPENDIX B

```
checksum := 0;
Current_Temp_1 := (TC_IN1 - 2700)/10;
Current_Temp_2 := (TC_IN2 - 2700)/10;
Temp_Output_String := ANY_TO_STRING(Current_Temp_1);
Temp_Output_String := INSERT(Temp_Output_String,'$$UT',1);
Temp_Output_String := INSERT(Temp_Output_String, 'LT',
MLEN(Temp_Output_String)+1);
Temp_Output_String :=
INSERT(Temp_Output_String,ANY_TO_STRING(Current_Temp_2),
MLEN(Temp_Output_String)+1);
Temp_Output_String := INSERT(Temp_Output_String, '#',
MLEN(Temp_Output_String)+1);
NumChars := ANY_TO_DINT(MLEN(Temp_Output_String));
FORIndex :=0TONumCharsBY1DO
    checksum := XOR_MASK(checksum,
ANY_TO_DINT(ASCII(Temp_Output_String,Index)));
END_FOR;
Temp_Output_String := INSERT(Temp_Output_String,
ANY_TO_STRING(checksum),
MLEN(Temp_Output_String)+1);
NumChars := ANY_TO_DINT(MLEN(Temp_Output_String));
OutputString :=Temp_Output_String;
```

What is claimed is:

1. A composition comprising:
    a first silk fibroin material comprising a predetermined nanostructure fabricated thereon; wherein the first silk fibroin material has a first beta sheet content and a first glass transition temperature (Tg1);
    a second silk fibroin material, having a second beta sheet content and a second glass transition temperature (Tg2);
    wherein the first silk fibroin material is in close contact with the second silk fibroin material, such that the predetermined nanostructure on the first fibroin material is substantially replicated onto the second silk fibroin material to produce an inverse imprint of the predetermined nanostructure.

2. The composition of claim 1, wherein the inverse imprint of the predetermined nanostructure has a resolution of at least 200 nm.

3. The composition of claim 1, wherein the inverse imprint of the predetermined nanostructure has a resolution from 100 nm to 500 nm.

4. The composition of claim 1, wherein the Tg1 of the first silk fibroin material is from 55° C. to 150° C.

5. The composition of claim 1, wherein the Tg1 of the first silk fibroin material is from 80° C. to 150° C.

6. The composition of claim 1, wherein the first silk fibroin material is a silk fibroin film, and wherein the second silk fibroin material is a silk fibroin film.

7. A composition comprising:
    a first silk fibroin material comprising a predetermined nanostructure fabricated thereon; wherein the first silk fibroin material has a first water content and a first glass transition temperature (Tg1);
    a second silk fibroin material, having a second water content and a second glass transition temperature (Tg2);
    wherein the first silk fibroin material is in close contact with the second silk fibroin material, such that the predetermined nanostructure on the first fibroin material is substantially replicated onto the second silk fibroin material to produce an inverse imprint of the predetermined nanostructure.

8. The composition of claim 7, wherein the inverse imprint of the predetermined nanostructure has a resolution of at least 200 nm.

9. The composition of claim 7, wherein the inverse imprint of the predetermined nanostructure has a resolution from 100 nm to 500 nm.

10. The composition of claim 7, wherein the first water content of the first silk fibroin material is from 1% to 10% as measured by weight percentage of the first silk fibroin material.

11. The composition of claim 7, wherein the Tg1 of the first silk fibroin material is from 55° C. to 150° C., and the first water content of the first silk fibroin material is from 1% to 10% as measured by weight percentage of the first silk fibroin material.

12. A composition comprising:
a plurality of negative silk fibroin imprints and a plurality of positive silk fibroin imprints;
wherein a positive silk fibroin imprint comprises a nanopattern, and wherein a negative silk fibroin imprint comprises an inverse of the nanopattern present on the positive silk fibroin imprint; and,
wherein the negative silk fibroin imprints are substantially replicas of one another, and wherein the positive silk fibroin imprints are substantially replicas of one another.

13. A method comprising the steps of:
providing a crystalized silk fibroin master comprising a predetermined nanostructure thereon;
(ii) layering the crystalized silk fibroin master with a silk fibroin material having a high water content;
(iii) applying heat, pressure, or combination thereof, under a condition sufficient to generate an imprinted silk fibroin material having an inverse of the predetermined nanostructure.

14. The method of claim 13, further comprising
(iv) annealing the imprinted silk fibroin material from step (iii) to induce crystallization.

15. The method of claim 13, further comprising using the imprinted silk fibroin material from step (iii) as a template for repeating steps (i) and (ii).

16. The method of claim 15, wherein the repeating is performed about 2-30 rounds.

17. A method for high throughput imprinting comprising repeating the method of claim 13.

18. The method of claim 13, wherein the high water content is at least 95%.

19. The method of claim 18, wherein the high water content is at least 99%.

20. The method of claim 13, wherein the condition comprises heating for a duration of about 2 seconds to 120 seconds.

21. The method of claim 13, wherein the condition comprises heating at about 75° C. to 130° C.

22. The method of claim 13, wherein the condition comprises applying pressure at about 10-100 PSI.

23. The method of claim 13, used for conformal imprinting.

* * * * *